United States Patent
Papameletis et al.

(10) Patent No.: US 10,761,131 B1
(45) Date of Patent: Sep. 1, 2020

(54) METHOD FOR OPTIMALLY CONNECTING SCAN SEGMENTS IN TWO-DIMENSIONAL COMPRESSION CHAINS

(71) Applicant: CADENCE DESIGN SYSTEMS, INC., San Jose, CA (US)

(72) Inventors: Christos Papameletis, Binghamton, NY (US); Brian Edward Foutz, Charlottesville, VA (US); Vivek Chickermane, Slaterville Springs, NY (US); Krishna Vijaya Chakravadhanula, Vestal, NY (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 16/140,701

(22) Filed: Sep. 25, 2018

(51) Int. Cl.
  *G01R 31/28* (2006.01)
  *G01R 31/3177* (2006.01)
  *G06F 30/398* (2020.01)

(52) U.S. Cl.
  CPC ..... *G01R 31/2851* (2013.01); *G01R 31/3177* (2013.01); *G06F 30/398* (2020.01)

(58) Field of Classification Search
  CPC .. G06F 30/398; G06F 11/263; G06F 17/5081; G06F 17/5045; G06F 2217/14; G01R 31/318547; G01R 31/2851; G01R 31/318583; G01R 31/3177; G01R 31/31704; G01R 31/318335
  See application file for complete search history.

(56) References Cited

U.S. PATENT DOCUMENTS

| | | | |
|---|---|---|---|
| 6,662,327 B1* | 12/2003 | Rajski | G01R 31/31813 714/738 |
| 6,671,839 B1* | 12/2003 | Cote | G01R 31/318563 324/73.1 |

(Continued)

OTHER PUBLICATIONS

Zacharia et al.; "Two-Dimensional Test Data Decompressor for Multiple Scan Designs"; Proceedings International Test Conference 1996. Test and Design Validity; Year: 1996; Conference Paper | (Year: 1996).*

(Continued)

*Primary Examiner* — Helen Rossoshek
(74) *Attorney, Agent, or Firm* — Tarolli, Sundheim, Covell & Tummino LLP

(57) ABSTRACT

Methods and computer-readable media for testing integrated circuit designs implement a physically efficient scan by optimally balancing and connecting scan segments in a 2-dimensional compression chain architecture. A compression architecture that provides an optimal and balanced configuration of scan segments in 2D compression grids to not only decrease test time, but also to maximize compression efficiency and limit wiring congestion for IC designs that contain complex scan segments facilitates efficient scanning of data by bisecting the elements into balanced partitions of the same target scan length. A segment padding algorithm, followed by a bisecting algorithm and ultimately an element swapping algorithm may be applied to optimally balance and connect scan segments in 2-D compression chains, optimizing an efficient compression architecture which minimizes scan testing resources and time.

20 Claims, 19 Drawing Sheets

(56) References Cited

U.S. PATENT DOCUMENTS

| | | | |
|---|---|---|---|
| 6,795,944 B2* | 9/2004 | Barnhart | G01R 31/318563 714/726 |
| 7,143,324 B2* | 11/2006 | Bratt | G01R 31/318547 714/726 |
| 7,155,648 B2* | 12/2006 | Jas et al. | G01R 31/318547 714/726 |
| 7,200,784 B2* | 4/2007 | Dervisoglu | G01R 31/318335 714/731 |
| 7,328,386 B2* | 2/2008 | Grinchuk | G01R 31/318547 714/726 |
| 7,461,309 B2* | 12/2008 | Kiryu | G01R 31/318544 714/724 |
| 7,814,444 B2* | 10/2010 | Wohl | G06F 30/327 716/100 |
| 7,890,827 B2* | 2/2011 | Rajski | G01R 31/318566 714/726 |
| 7,925,941 B2* | 4/2011 | Bhatia | G01R 31/318547 714/726 |
| 8,006,150 B2* | 8/2011 | Sinanoglu | G01R 31/318547 714/726 |
| 8,522,096 B2* | 8/2013 | Wang | G01R 31/318572 714/30 |
| 8,615,692 B1* | 12/2013 | Khurana | G01R 31/318575 702/60 |
| 8,839,181 B2* | 9/2014 | Liu | G01R 31/318583 716/136 |
| 9,465,896 B1* | 10/2016 | Cunningham | G06F 30/30 |
| 9,470,755 B1* | 10/2016 | Foutz | G01R 31/318583 |
| 9,470,756 B1* | 10/2016 | Wilcox | G01R 31/318547 |
| 9,501,590 B1* | 11/2016 | Cunningham | G01R 31/31704 |
| 9,513,335 B1* | 12/2016 | Wilcox | G01R 31/318547 |
| 2005/0149799 A1* | 7/2005 | Hemia | G01R 31/3008 714/726 |
| 2015/0276874 A1* | 10/2015 | Morton | G01R 31/3177 714/727 |
| 2015/0285854 A1* | 10/2015 | Kassab | G01R 31/31921 702/58 |
| 2016/0266202 A1* | 9/2016 | Mittal | G01R 31/3177 |
| 2020/0004913 A1* | 1/2020 | Goel | G06F 17/18 |

OTHER PUBLICATIONS

Liang et al.; "Two-Dimensional Test Data Compression for Scan-Based Deterministic Bist"; Proceedings International Test Conference 2001 (Cat. No. 01CH37260); Year: 2001; Conference Paper | (Year: 2001).*

Lin et al.; "Using Dynamic Shift to Reduce Test Data Volume in High-Compression Designs"; 2014 19th IEEE European Test Symposium (ETS); Year: 2014; Conference Paper | (Year: 2014).*

* cited by examiner

FIG. 5C

METHOD FOR OPTIMALLY CONNECTING SCAN SEGMENTS IN TWO-DIMENSIONAL COMPRESSION CHAINS

TECHNICAL FIELD

The present invention relates to methods and computer-readable media for testing integrated circuit designs; the invention also relates to an integrated circuit implementing a physically efficient scan by optimally balancing and connecting scan segments in a 2-dimensional compression chain architecture.

BACKGROUND

Modern integrated circuits ("ICs") in production require an enormous volume of components. During the manufacturing process, ICs must be quickly tested to determine whether each integrated circuit is functioning correctly without any physical defects. Testing of those ICs requires a large number of test patterns. Transition fault testing has become more prominent, requiring many times more patterns than before. As the chip size and the ratio of logic to be tested per input/output test pin increases dramatically, the amount of data necessary to be supplied by techniques such as automatic test pattern generation ("ATPG") has become voluminous. Design for test ("DFT") designers are faced with the challenge of inputting, for each of these large chips, a huge volume of scan test sequences via a minimal number of test pins. Therefore, with ATPG only, the required test time increased and the required amount of tester memory increased, both of which increased cost associated with DFT.

In order to address these challenges, DFT designers have used a technique called Test Compression. Test Compression reduces test data volume and test application time ("TAT") while retaining test coverage. Using Test Compression, highly compressed test data can be loaded onto the scan chains from low-pin count automated test equipment ("ATE"), using an on-board DeCompressor which decompresses the compressed test data before loading them to a large number of scan chains. After applying the scan chain data to the IC, the response data is then compressed for measurement and comparison. Test Compression recognizes that only a small percentage of scan cells in a scan chain ("care bits") generated by ATPG are necessary for testing. Test Compression modifies the design to apply the care bits in shorter scan chains, reducing the TAT. The compression ratio generated by Test Compression methods is capable of greatly reducing the test data volume and TAT. For example original data having a volume of 6 Gb and TAT of 20 seconds is, at a 100× compression ratio, reduced by 99% to 60 Mb and TAT of 0.2 seconds.

Test Compression is driven by two structures: a Decompressor and a Compressor (or Compactor). The Decompressor drives the compressed test stimuli onto the IC from the small number of scan-in pins on the ATE to the large number of internal scan channels which feed the logic under test. The Decompressor is designed to allow a continuous flow of stimuli so that it is possible to load the scan chain data for a given test onto the IC and to unload from the IC the previous test response data to the Compressor, all in a single clock cycle. Compression and De-compression logic generally are built using discrete logic gates such as XORs, multiplexers and flip-flops and placed inside a logic module called CoDec which is normally placed in one corner of the IC. Wires transfer test stimuli from the DeCompressor inside the CoDec to the head of the scan channels which may be distributed across the area of the IC Similarly wires from the tails of the scan channels transfer the test stimuli to the Compressor inside the CoDec. Wiring all of these connections directly between the scan chains scattered over the surface area of the IC and the decompression and compression logic is referred to as traditional global scan wiring.

As chip complexity increases, compression ratios have to increase. However, physical chip layout can prevent implementation of large compression ratios. At a certain point, physical design can become a bottleneck, limiting the total number of wires that can be manufactured in contact with on-board location of the decompression logic and compression logic. A bisecting distribution method may be utilized to determine and divide the testable logic into a 2-dimensional grid on the IC in a physically efficient manner such that the application and scanning of test data can be completed most efficiently.

Consequently, when IC designs contain more complex scan segments that are longer than one bit, the bisection algorithm that is applied may result in imbalanced bisected grid partitions that contain scan chains that are not the exact same length. When imbalanced, the compression implementation is inefficient because, for example, if one scan chain length is shorter than the target length, and one scan chain length is longer than the target length, the test time will likely increase, as all of the chains will have to be run as if they consist of the higher number of bits when scanning in test data.

Further, for the compression structure provided by the 2D grid, each of the horizontal and vertical wires running across the chip drives or conveys responses to the scan chains. As such, to optimize an efficient compression architecture, the scan chains need to align well with the wires that run horizontally and vertically such that the scan chain structure can align with the optimal compression design, without unnecessarily extending scan length, which increases test time.

Accordingly a compression architecture that provides an optimal and balanced configuration of scan segments in 2D compression grids to not only decrease test time, but also to maximize compression efficiency and limit wiring congestion for IC designs that contain complex scan segments is needed to facilitate the most efficient scanning of data by bisecting the elements into balanced partitions of the same scan length.

BRIEF DESCRIPTION OF THE DRAWINGS

FIG. 5C illustrates an implementation of a distance-based grid for evaluating padding candidates in order of increasing Manhattan distance.

DESCRIPTION OF EMBODIMENTS

Figure 1:
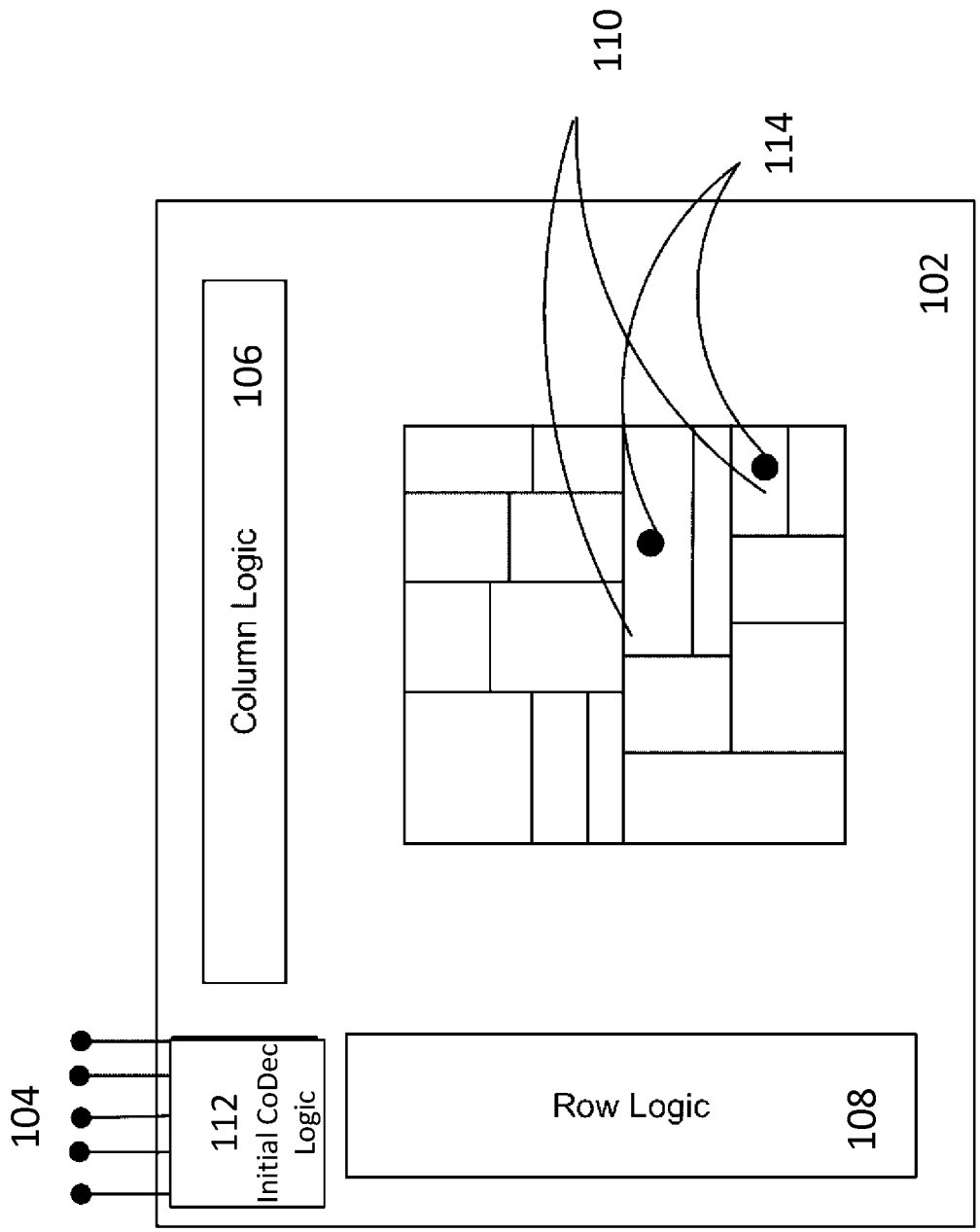
FIG. 1 illustrates an embodiment of an IC dividing the testable logic into the 2-dimensional grid according to a bisecting distribution scheme.

The following description of embodiments provides non-limiting representative examples referencing numerals to particularly describe features and teachings of aspects of the invention. The embodiments described should be recognized as capable of implementation separately, or in combination, with other embodiments from the description of the embodiments. A person of skill in the art reviewing the description of embodiments should be able to learn and understand the different described aspects of the invention. The description of embodiments should facilitate understanding of the invention so that other implementations of aspects of the invention, not specifically described but within the knowledge of a person of skill in the art having read the description of embodiments, would be understood to be consistent with application of aspects of the invention.

One aspect of the present disclosure is to provide methods for performing scan chain connection of an integrated circuit by optimally balancing and connecting scan segments in a 2-dimensional compression chain architecture. A compression architecture that provides an optimal and balanced configuration of scan segments in 2D compression grids not only decreases test time, but also maximizes compression efficiency and limits wiring congestion for IC designs that contain complex scan segments to facilitate efficient scanning of data by bisecting the elements into balanced partitions of the same scan length equal to a target scan length.

When IC designs contain scan segments that are typically longer than one bit, application of a bisecting algorithm to distribute compression logic across the IC, that divides testable logic into a 2-dimensional grid so as to implement a physically efficient scan design, may result in grid partitions that contain scan chains that are imbalanced. The present disclosure provides a method to address these inefficiencies by optimally defining scan segments to generate balanced partitions based on a target scan length, the number of scan bits that belong to the same compression scan chain, to enhance efficiency for the associated scanning of test data.

For example, IC designs may include single bit registers. Because the length of each single bit register is one bit, the single bit registers may be divided up into scan chains of a specific target length in order to get to the target length of the chain. A single bit register may include one stage of D-flip-flops (DFF). However, IC designs that include a combination of single and multi-bit registers may be more difficult to divide into one or multiple scan chains of a same target scan chain length. Multi-bit registers may include multi-stage flip flops, which may include a single cell that contains more than one bit, for example 2-64 bits; serial shift registers, which may include a string of a single state of DFFs that are serially concatenated to functionally shift data from one side to the other over a certain set number of clock cycles; fixed/preserved segments that may include registers that are pre-connected in a certain scan chain configuration so that during scan testing, the ordering of the elements is preserved; abstract segments, which may include serial shift registers or scan chains that are embedded inside a module hierarchy or a technology partition; and floating segments, which may include registers that are grouped together consecutively in a scan chain, but the ordering of which is determined during physical placement.

To optimize an efficient compression architecture, the scan chains need to align well with the wires that run horizontally and vertically such that the scan chain structure can align with the optimal compression design, without unnecessarily extending scan length, which increases test time. Efficient compression architecture may be achieved by utilizing two grids, a first that defines a compression structure, and a second that defines scan chains. The scan chain grid may be configured such that it can plug into an existing compression structure without modification.

In one embodiment, a method, implemented by a computer, for performing scan chain connection of an integrated circuit by optimally balancing and connecting scan segments in a 2-dimensional compression chain architecture, may first include implementing a distance-based grid to pad scan segments with padding scan elements to achieve a target scan chain length, as illustrated in FIGS. 5A-5B, 6A-6B and 7A-7B, for example. Upon determining a target scan chain length, an area of an integrated circuit may be divided into a number of partitions of scan elements. Responsive to identifying an imbalance of scan elements that cannot be redistributed between the partitions to configure partitions each with a respective total scan length equal to the target scan chain length, an absolute difference between the scan length of the respective imbalanced scan element and the target scan chain length may be determined. A first identified imbalanced scan element may be padded with at least one padding scan element to extend the scan length of the identified imbalanced scan element to the target scan chain length. The padding scan element may be selected based on being located at an optimally determined distance from the identified scan element to minimize test time and wire length. Remaining imbalanced scan elements may also be padded, and the imbalanced scan elements may be connected to the padding scan elements using wire to optimally configure scan chains for the determined target scan chain length.

Second, a bisection distribution scheme may be utilized to divide the testable logic into a 2-dimensional grid, as illustrated in FIG. 1. The bisection distribution scheme involves construction of an imaginary grid, on the IC, where the logic from the CoDec can be distributed to points on a grid evenly. Distributing the CoDec to points on a grid evenly is to be understood as meaning that, in each location on the IC, the output/input of the CoDec is provided to and unloaded from the same number of flops for testing scan chains.

Test data available from scan-in pins of the IC is decompressed by initial decompression logic. After decompression, all of the terms available from the scan in pins are available for application to the grid. Column logic distributes the terms needed from the initial test data along a first axis. Row logic distributes the terms needed from the initial test data along a second axis. Placement of the wiring extending from the column logic to each of the different points along the grid, however, is determined in accordance with the bisecting algorithm described further herein. At the point in time when the placement of the grid wiring is determined using the bisecting algorithm, all of the functional logic on the chip has already been implemented, and the flops associated with DFT are implemented on the chip. Only once the bisecting algorithm is completed and the bounds of the grid cells are determined can the wires extending from the column logic be overlaid on to the IC such that there are gates placed in the appropriate locations within the grid cells. Similarly, placement of the wiring extending from the row logic inside of the grid is determined in accordance with the bisecting algorithm. Implementation of the bisecting algorithm can result in code, a schematic, or an image of the bounds of the grid cells within which the compression and decompression logic should be placed. In some embodiments, implementation of the bisecting algorithm results in a determination of the total amount of wire required to connect all of either and/or both of the compression logic across the neighboring grid cells and the decompression logic across the neighboring grid cells.

Finally, the vertical and horizontal bisecting distribution partitions may be redistributed to divide single and multi-bit scan segments into balanced partitions of the chip area of an IC utilizing element swapping, as illustrated in FIGS. 1, 2D, 3B and 7D, for example. For each respective partition of scan elements, a respective absolute difference between the total scan length of the respective partition and the target scan chain length may be determined. Responsive to a first respective absolute difference of a first respective partition being greater than zero, a second respective partition having a second respective absolute difference greater than zero may be identified. Upon identifying scan elements in the first respective partition and the second respective partition that are shorter than or equal to the respective absolute difference, the identified scan elements may be redistributed between the first respective partition and the second respective partition to optimally reduce the absolute difference. Remaining partitions having an absolute difference greater than zero may be balanced utilizing element swapping, and the scan elements within each balanced partition may be connected with wire to optimally configure a 2-dimensional compression chain for a determined target scan chain length.

FIG. 1 illustrates an embodiment of an IC dividing the testable logic into the 2-dimensional grid according to a bisecting distribution scheme for a logic module, such as a CoDec. FIG. 1 includes an IC 102. As test input, the IC accepts M scan-in/scan-out pins 104. The M scan-in/scan-out pins are used to provide test data to N different scan chains.

The test data available from the scan-in pins is decompressed by initial decompression logic 112. After decompression, all of the terms available from the M scan in pins are available for application to the grid, which was selected to be of the size Y by X. Column logic 106 distributes the terms needed from the initial test data along a first axis. Row logic 108 distributes the terms needed from the initial test data along a second axis. Placement of the wiring extending from the column logic 106 to each of the different points along the Y by X grid, however, is determined in accordance with the bisecting algorithm described further herein. At the point in time when the placement of the grid wiring is determined using the bisecting algorithm, all of the functional logic on the chip has already been implemented, and the flops associated with DFT are implemented on the chip. Only once the bisecting algorithm is completed and the bounds of the grid cells are determined can the wires extending from the column logic 106 be overlaid on to the IC such that there are gates placed in the appropriate locations within the grid cells. Similarly, placement of the wiring extending from the row logic 108 inside of the grid is determined in accordance with the bisecting algorithm. Implementation of the bisecting algorithm can result in code, a schematic, or an image of the bounds of the grid cells within which the compression and decompression logic should be placed. In some embodiments, implementation of the bisecting algorithm results in a determination of the total amount of wire required to connect all of either and/or both of the compression logic across the neighboring grid cells and the decompression logic across the neighboring grid cells.

Only once the bisecting algorithm is completed and the grid cells determined can the wires extending from the row logic be overlaid on to the IC such that there are gates placed in the appropriate locations within the grid cells. In an embodiment, the final combinational gates needed for the CoDec are not placed in the exact center of the grid cells, but are instead placed proximate to the tail of the scan chain in the grid cell. In some embodiments, the final combinational gates needed for the CoDecs are placed in a location within the grid cells according to a designer's choice. Grid cells such as those shown in 110 can be formulated based on application of the bisecting algorithm.

A test scan is performed over the contact points 114. The test data is loaded onto the flops of the integrated circuit, the test data is stimulated, and the response data is loaded off the flops of the integrated circuit in order to check for manufacturing faults. In an embodiment, the contact points are used for only one of loading test data onto the integrated circuit or retrieving response data from the integrated circuit. In an embodiment, two sets of contact points are provided in a single grid cell, one set for loading test data onto the integrated circuit and one set for loading response data off the integrated circuit.

Figure 2A:
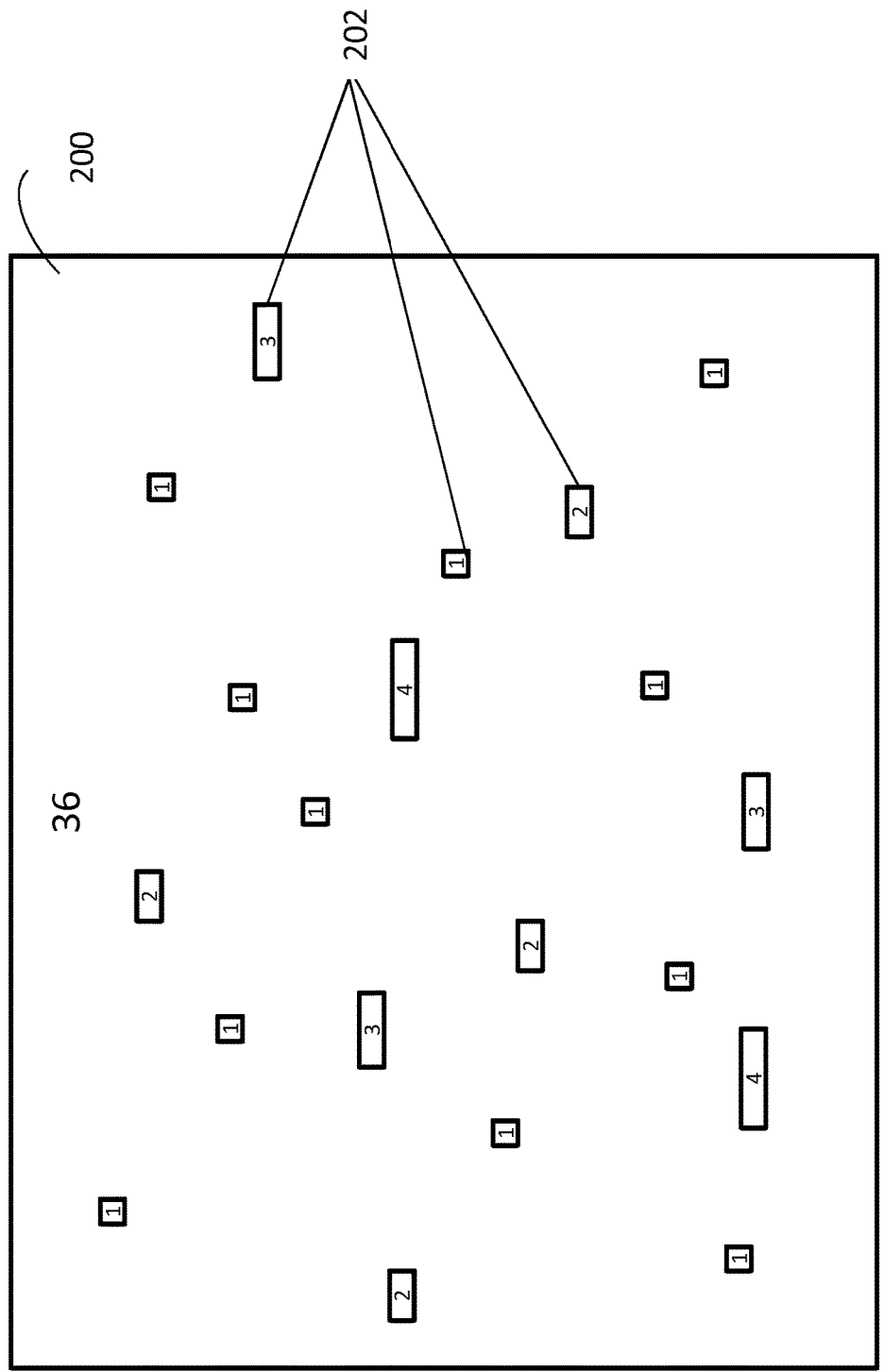
FIG. 2A illustrates distribution of single and multi-bit scan segments over the chip area of a 2-dimensional IC.

FIGS. 2A-2D illustrate a computer implementation of a method for performing scan chain connection of an integrated circuit by optimally balancing and connecting scan segments in a 2-dimensional compression chain architecture, utilizing element swapping. FIG. 2A illustrates a distribution of single and multi-bit scan segments, such as 202, over a chip area 200 of a 2-dimensional IC. The total scan length of a chip area is the total number of bits distributed over the area. For example, in FIGS. 2A-2D, the total scan length is 36 bits. A target scan length may be determined, which may facilitate an optimal efficient compression implementation, and may be determined based on an associated compression grid, such as the grid illustrated in FIG. 1, by connecting scan elements of a grid partition into scan chains of the same scan length, the determined target length, to balance grid partitions. For example, in FIGS. 2A-2D, the target scan length is determined to be nine bits.

Figure 2B:
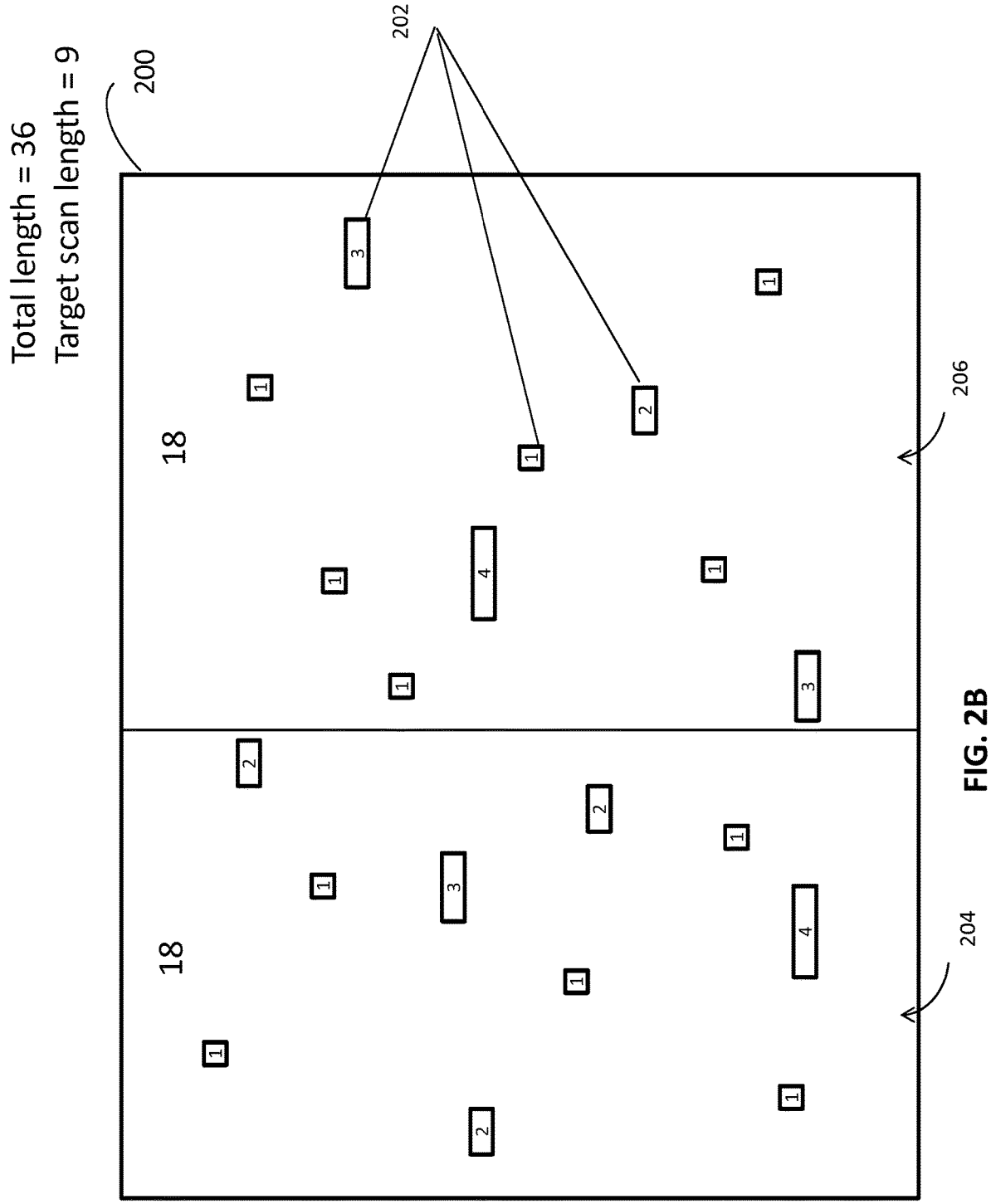
FIG. 2B illustrates an implementation of a vertical bisecting distribution scheme for dividing single and multi-bit scan segments into partitions over the chip area of a 2-dimensional IC.

FIG. 2B illustrates an implementation of a vertical bisecting distribution scheme for dividing single and multi-bit scan segments, such as 202, into partitions, such as partitions 204 and 206, over chip area 200 of a 2-dimensional IC. To achieve an optimal configuration, the scan elements may be divided into a number of partitions. Each partition may have as close to the same scan length, total number of bits, as possible. The number of partitions may be configured to facilitate an optimal efficient compression implementation, and may be determined based on an associated compression grid, such as the grid illustrated in FIG. 1. For example, as illustrated in FIG. 2B, the scan elements are divided optimally into two partitions, each including eighteen bits.

Figure 2C:
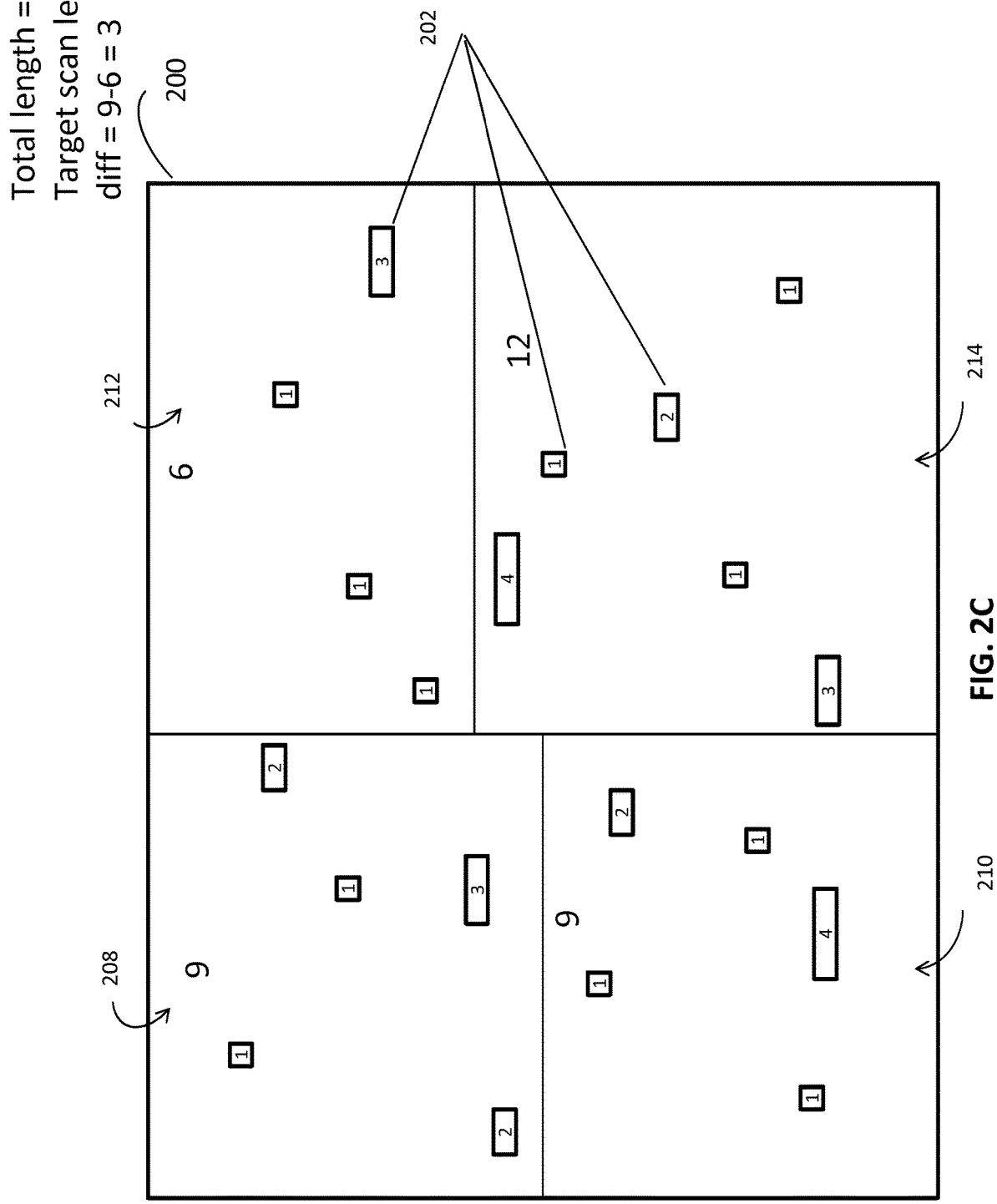
FIG. 2C illustrates an implementation of vertical and horizontal bisecting distribution schemes for dividing single and multi-bit scan segments into partitions over the chip area of a 2-dimensional IC.

FIG. 2C illustrates an implementation of a horizontal bisecting distribution scheme implemented with the vertical bisecting distribution scheme of FIG. 2B, for dividing single and multi-bit scan segments into partitions over the chip area of a 2-dimensional IC, which results in four partitions. To achieve an optimal configuration, the scan elements may be divided into a number of partitions, where each partition may have as close to the same scan length, total number of bits, as possible. For example, in FIG. 2C, an optimal configuration would include four partitions, each including nine bits, the determined target scan length. However, based on the lengths of the individual scan segments, a bisecting algorithm alone cannot be utilized to achieve this optimal configuration. As such, partitions 208 and 210 each include the target scan length of nine bits, but partition 212 has a total scan length of six bits and partition 214 has a total scan length of twelve bits. For each respective partition, a respective absolute difference between the total scan length and the target scan chain length may be determined. For example, the absolute difference of partition 212 is three (the absolute difference between the total scan length of partition 212, six, and the target scan length, nine), and the absolute difference of partition 214 is three (the absolute difference between the total scan length of partition 214, twelve, and the target scan length, nine).

For scan testing, an optimal configuration of partitions containing the same number of bits resulting in scan chains of the same length, the test will be performed for the same number of cycles, for example nine cycles for a target length of nine. In this case, for example, because partition 214 has a scan length of twelve, which exceeds the target scan length of nine, every scan test will need to be performed for twelve cycles, which significantly increases test time.

Figure 2D:
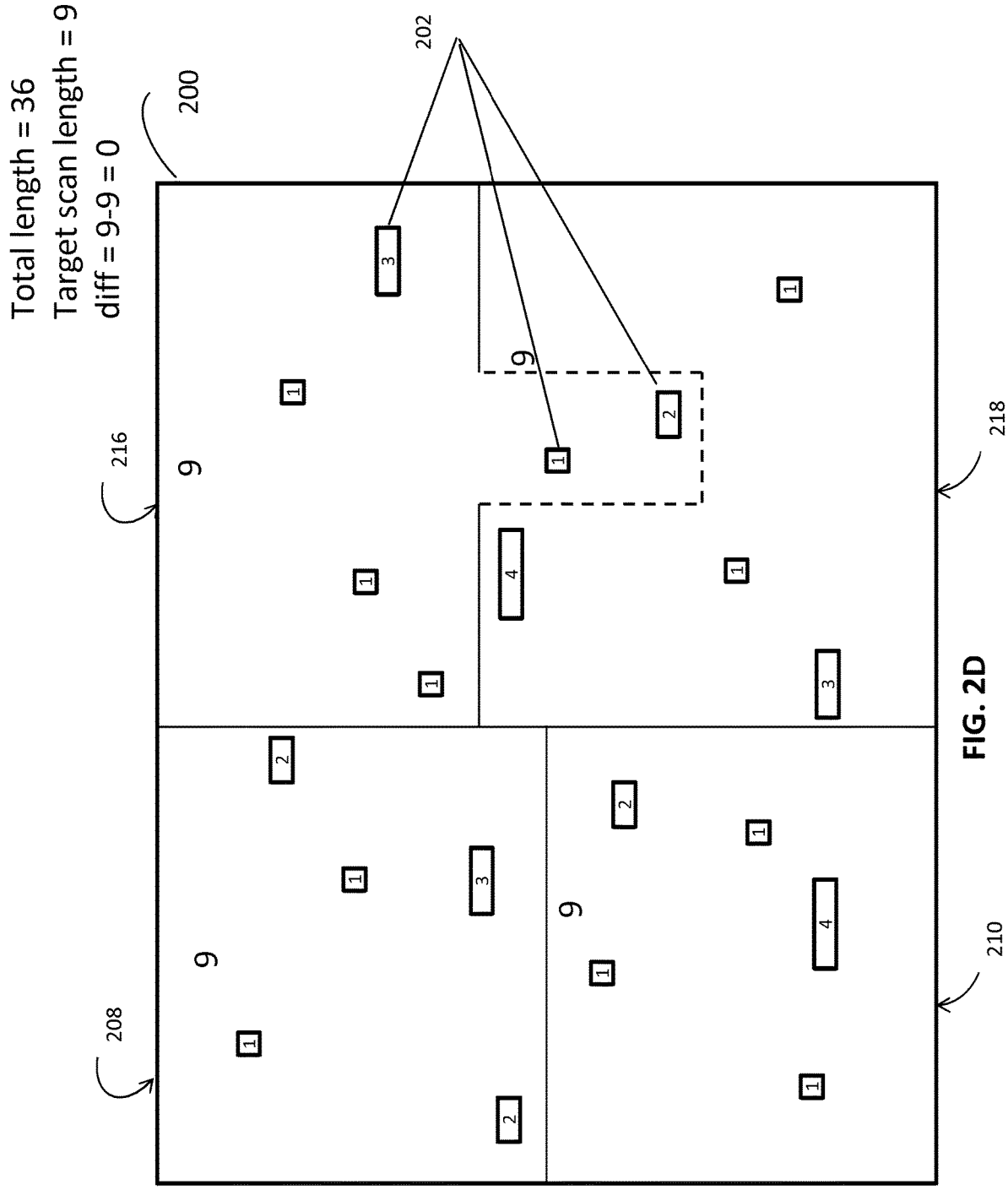
FIG. 2D illustrates an implementation of re-distribution vertical and horizontal bisecting distribution schemes for dividing single and multi-bit scan segments into balanced partitions over the chip area of a 2-dimensional IC via unidirectional element swapping.

To address this imbalance and resulting inefficient scan testing, element swapping, as is illustrated in FIG. 2D, may be implemented. Element swapping may be utilized to provide re-distribution of vertical and horizontal bisecting distribution schemes for dividing single and multi-bit scan segments, such as 202, into balanced partitions over chip area 200 of a 2-dimensional IC, such as redistributing the scan segments in unbalanced partitions 212 and 214, as illustrated in FIG. 2C into balanced partitions 216 and 218, as illustrated in 2D.

Specifically, when an absolute difference is greater than zero, such as the respective absolute difference of partitions 212 and partition 214, scan elements may be moved between partitions 212 and 214 to reduce the absolute difference, resulting in redistributed partitions 216 and 218, respectively. Scan elements that are shorter than or equal to the respective absolute difference may be identified. By redistributing at least one of the identified scan elements that are shorter than or equal to the respective absolute difference, the respective absolute differences may be reduced, which results in more balanced partitions as close to the target scan length as possible.

For example, the one bit and two bit scan elements of partition 214 that are closest to the bisection boundary between partitions 212 and 214 may be moved from partition 214 into partition 212 to optimally reduce the respective absolute differences, resulting in partitions 216 and 218, respectively, each having a balanced scan length of nine equal to the target scan length.

In another example, if after a first iteration of element swapping, an imbalance in partition scan length still exists, updated absolute differences may be calculated. Elements that are shorter than or equal to the respective updated absolute differences may be swapped between the imbalanced partitions having an absolute difference greater than zero.

This process will repeat so long as there are imbalanced partitions and eligible scan segments available for swapping. Once the partitions have been balanced and redistributed to optimally configure a 2-dimensional compression scan chain for a determined scan chain length, scan elements within each respective partition may be connected with wire to create optimal scan chains.

When performing element swapping, elements closest to the boundary between bisection partitions may be processed first to minimize wire length, when balancing the partitions. As chip complexity increases, compression ratios may also increase. However, a physical chip layout can prevent implementation of large compression ratios. At a certain point, the physical chip design can limit the total number of wires that can be manufactured in contact with the on-board location of the decompression logic and the compression logic. Accordingly, to achieve optimal compression, wiring, such as the wiring dictated by element swapping, may be minimized. In some embodiments, when selecting which elements to swap between partitions this wire length may also be balanced with the resulting scan length to provide an optimal configuration. Increased scan wire length adversely affects the physical properties and design of the chip, which may result in congestion. As such, when performing element swapping, elements that are farther away from the boundary between bisection partitions, as opposed to other potential swapping elements, may be processed last to reduce the scan wire length.

Figure 3A:
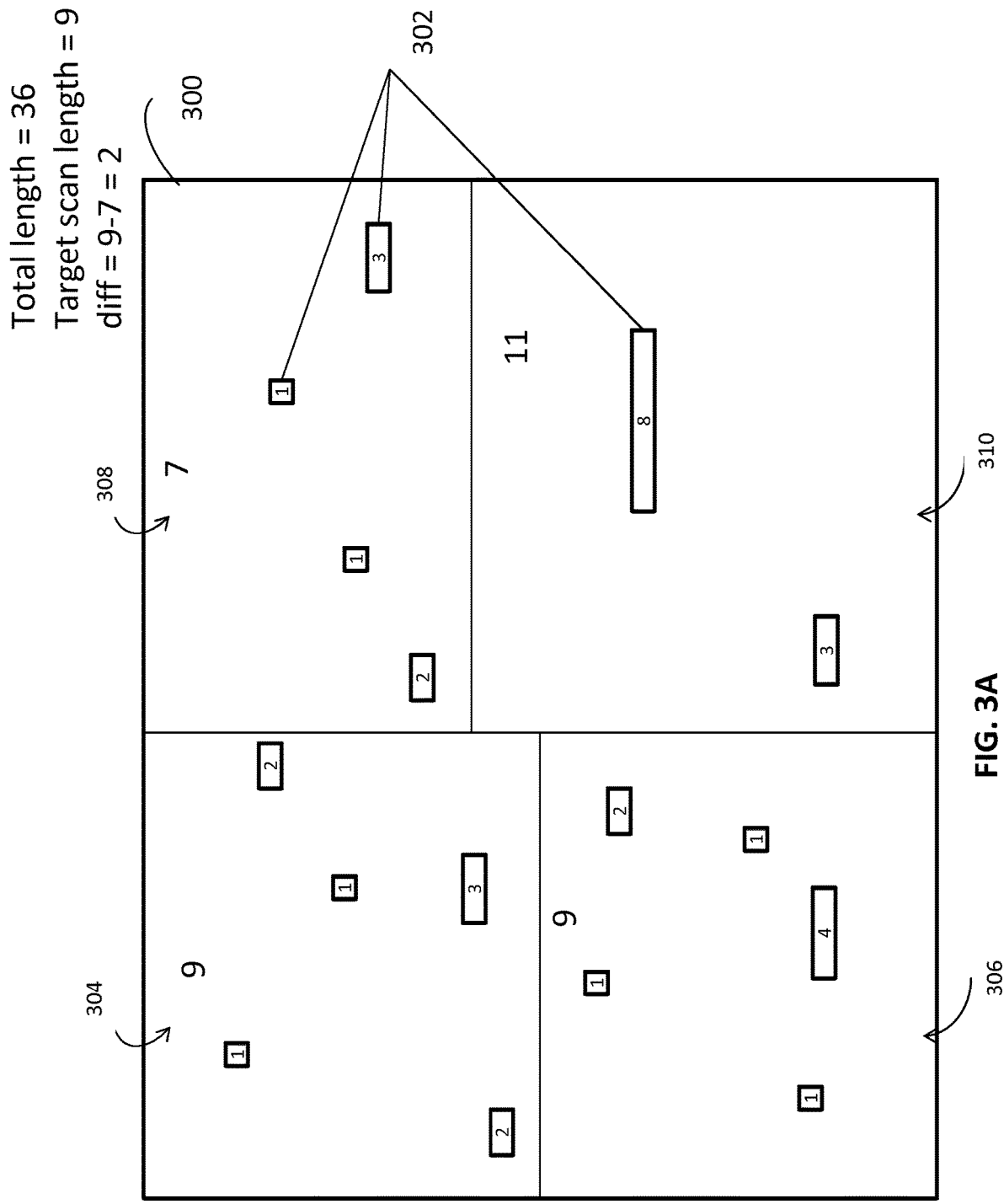
FIG. 3A illustrates an implementation of vertical and horizontal bisecting distribution schemes for dividing single and multi-bit scan segments into partitions over the chip area of a 2-dimensional IC.
Figure 3B:
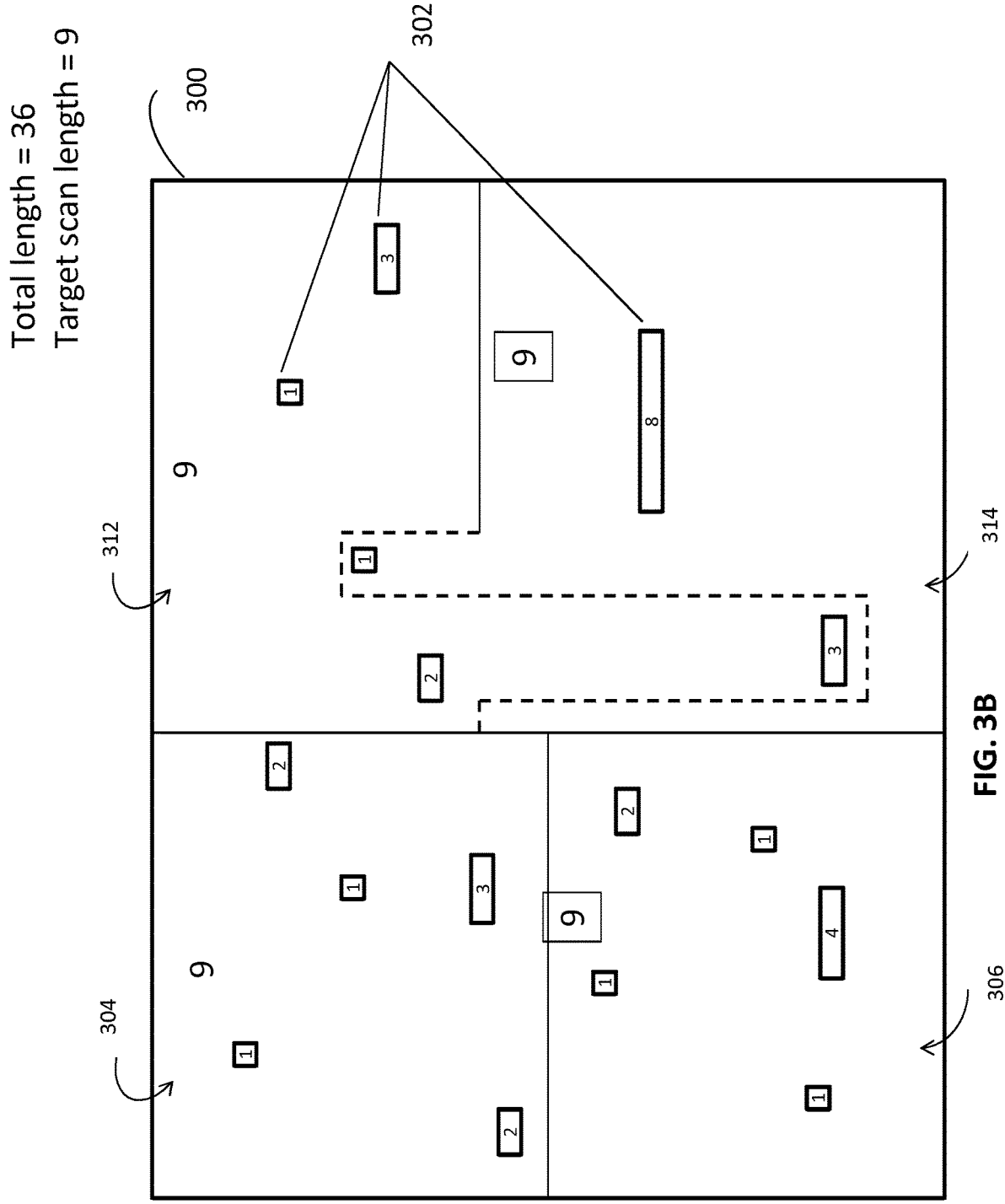
FIG. 3B illustrates an implementation of re-distribution vertical and horizontal bisecting distribution schemes for dividing over single and multi-bit scan segments into balanced partitions over the chip area of a 2-dimensional IC via bidirectional element swapping.

FIGS. 3A-3B illustrate an implementation of re-distribution of vertical and horizontal bisecting distribution schemes for dividing over single and multi-bit scan segments, such as 302, into balanced partitions over chip area 300 of a 2-dimensional IC via bidirectional element swapping. In FIG. 3A, an optimal configuration may include four partitions, each including nine bits, the determined target scan length, bits. However, based on the lengths of the individual scan segments, a bisecting algorithm alone cannot be utilized to achieve this optimal configuration. As such, partitions 304 and 306 each include the target scan length of nine bits, but partition 308 has a total scan length of seven bits and partition 310 has a total scan length of eleven bits. For each respective partition, a respective absolute difference between the total scan length and the target scan chain length may be determined. For example, the absolute difference of partition 308 is two (the absolute difference between the total scan length of partition 308, seven, and the target scan length, nine), and the absolute difference of partition 310 is two (the absolute difference between the total scan length of partition 310, eleven, and the target scan length, nine).

Unlike partition 214 in FIG. 2C, all of the scan elements in partition 310 exceed the respective absolute difference of partition 308, and accordingly, redistributing any of the scan elements from partition 310 to 308 would result in an absolute difference, still greater than zero, and in this case, a scan length greater than the target scan length.

Accordingly, bidirectional element swapping may be utilized to redistribute scan elements from partition 310 to partition 308, as well as to redistribute scan elements from partition 308 to partition 310 to balance the resulting partitions, partition 312 and 314, respectively, as illustrated in FIG. 3B.

For example, the three bit scan element of partition 310 may be moved from partition 310 to partition 308. However, moving this three bit scan element alone results in each of the respective resulting partitions having an absolute difference greater than zero. Accordingly, an additional element swap may be made in the opposite direction, from partition 308 to partition 310 to further balance the partitions. The one bit scan element that is closest to the bisection boundary between partitions 308 and 310 may be moved from partition 308 to partition 310, to optimally reduce the respective absolute differences, resulting in partitions 312 and 314, respectively, each having a balanced scan length of nine, the target scan length. The scan elements of partitions 312 and 314 respectively may be connected with wire to create optimal scan chains.

In yet another embodiment, a chip area of a 2-dimensional IC may be divided into three partitions. The choice to divide the chip area into three partitions may be based on a configuration to facilitate an optimal efficient compression implementation, and may be determined based on alignment with an associated compression grid, such as the grid illustrated in FIG. 1. Element swapping may be utilized to balance the scan elements across the three partitions. The element swapping algorithm may be applied twice to facilitate the balancing of the three partitions.

For example, the element swapping algorithm may first be applied with a target of one third of the total number of bits to be distributed to a first partition, and the remaining two thirds of the total number of bits to be distributed to a second and third partitions. The bits may be distributed accordingly between the first partition, and the second and third partitions combined. The elements swapping algorithm may then be applied a second time to balance the remaining bits in the second and third partitions with a target of half of the remaining bits to be distributed.

For both applications of the element swapping algorithm, when an absolute difference between a total number of bits of a respective partition and the target scan chain length is greater than zero, scan elements may be moved between the respective partitions to reduce the absolute difference, resulting in the redistribution of the respective partitions. Scan elements that are shorter than or equal to the respective absolute difference may be identified. By redistributing at least one of the identified scan elements that are shorter than or equal to the respective absolute difference, the respective absolute differences may be reduced, which results in more balanced partitions.

This process will repeat so long as there are imbalanced partitions and eligible scan segments available for swapping. Once the partitions have been balanced and redistributed to optimally configure a 2-dimensional compression scan chain for a determined scan chain length, scan elements within each respective partition may be connected with wire to create optimal scan chains.

Figure 4A:
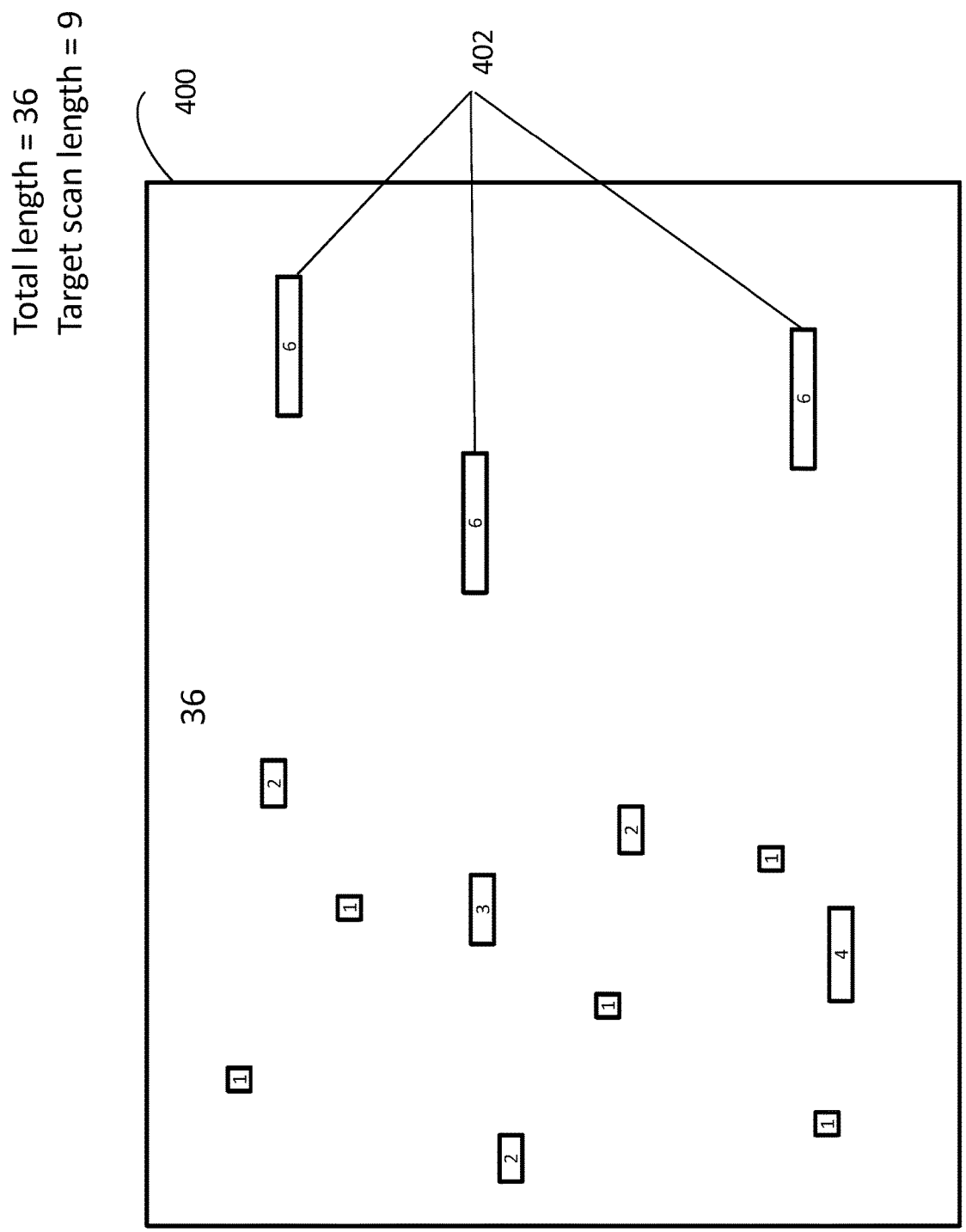
FIG. 4A illustrates distribution of single and multi-bit scan segments over the chip area of a 2-dimensional IC.
Figure 4B:
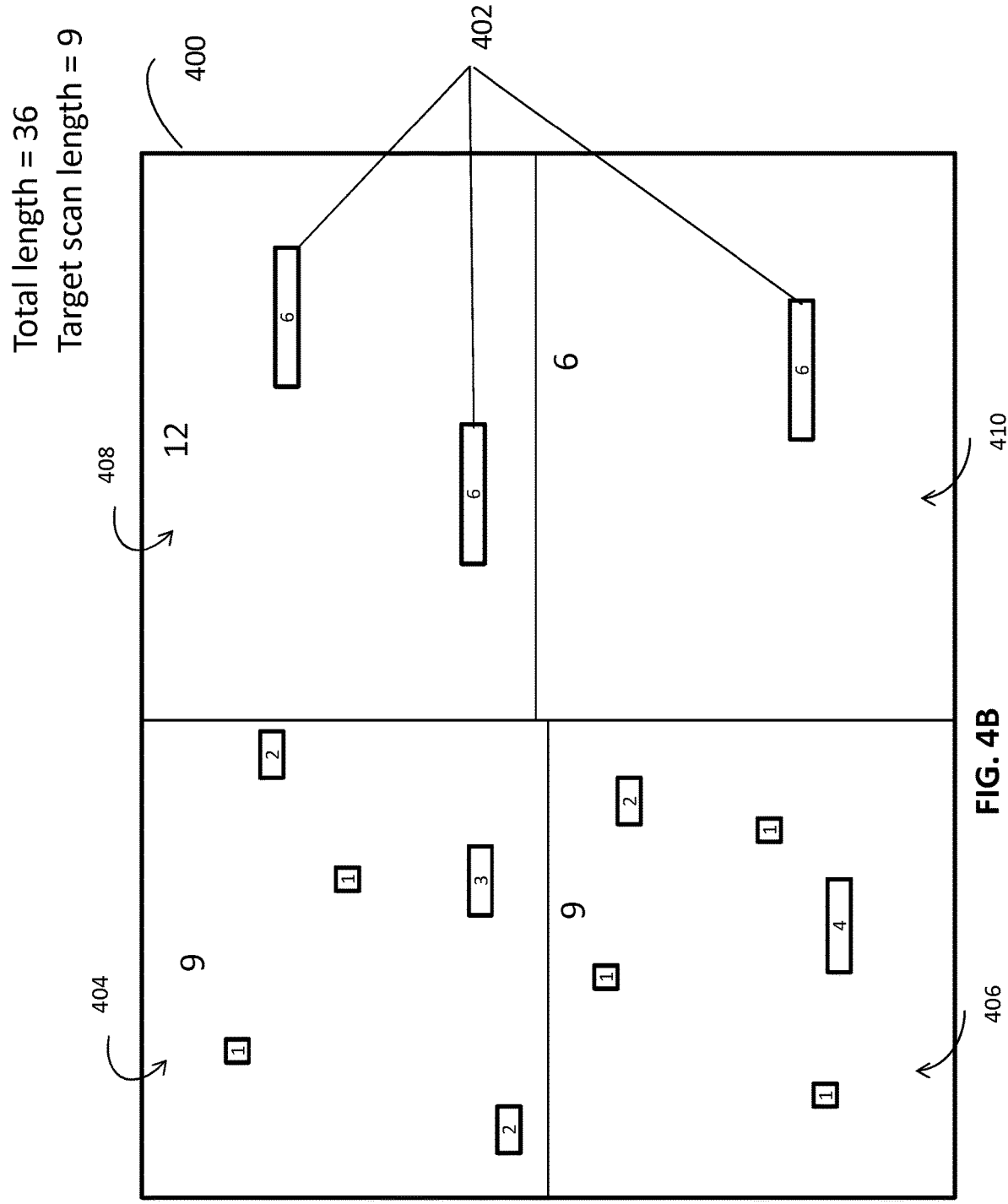
FIG. 4B illustrates an implementation of vertical and horizontal bisecting distribution schemes for dividing single and multi-bit scan segments into imbalanced partitions over the chip area of a 2-dimensional IC.

FIGS. 4A-4B illustrate distribution of single and multi-bit scan segments over chip area 400 of a 2-dimensional IC, and an implementation of vertical and horizontal bisecting distribution schemes for dividing single and multi-bit scan segments, such as 402 into imbalanced partitions over the chip area of a 2-dimensional IC. The resulting imbalance of scan elements includes scan elements that cannot be redistributed between the partitions to configure the partitions each with a respective total scan length equal to the target scan chain length.

As illustrated in 4B, scan segments, such as 402, may be divided into partitions, such as partitions 404, 406, 408, and 410. To achieve an optimal configuration, the scan elements may be divided into a number of partitions, where each partition may have as close to the same scan length, total number of bits, as possible. For example, in FIG. 2C, an optimal configuration may include four partitions, each including nine bits, the determined target scan length. However, based on the lengths of the individual scan segments, a bisecting algorithm alone cannot be utilized to achieve this optimal configuration. Consequently, partitions 404 and 406 each include the target scan length of nine bits, but partition 408 has a total scan length of twelve bits and partition 410 has a total scan length of 6.

Additionally based on the lengths of scan segments 402, each having a length of six bits, utilizing the element swapping algorithm alone may be ineffective in rebalancing grid partitions, such as partitions 408 and 410. An insolvable imbalance, like that illustrated in partitions 408 and 410 of FIG. 4B may result when the sum of the lengths of the segments is exactly divisible by the number of target grid partitions, but their individual lengths make and exact factoring/partitioning impossible. Each of the three scan segments 402 have a length of six bits. As such, it is impossible to divide those scan segments into two partitions, each having a total length of nine bits.

Figure 5A:
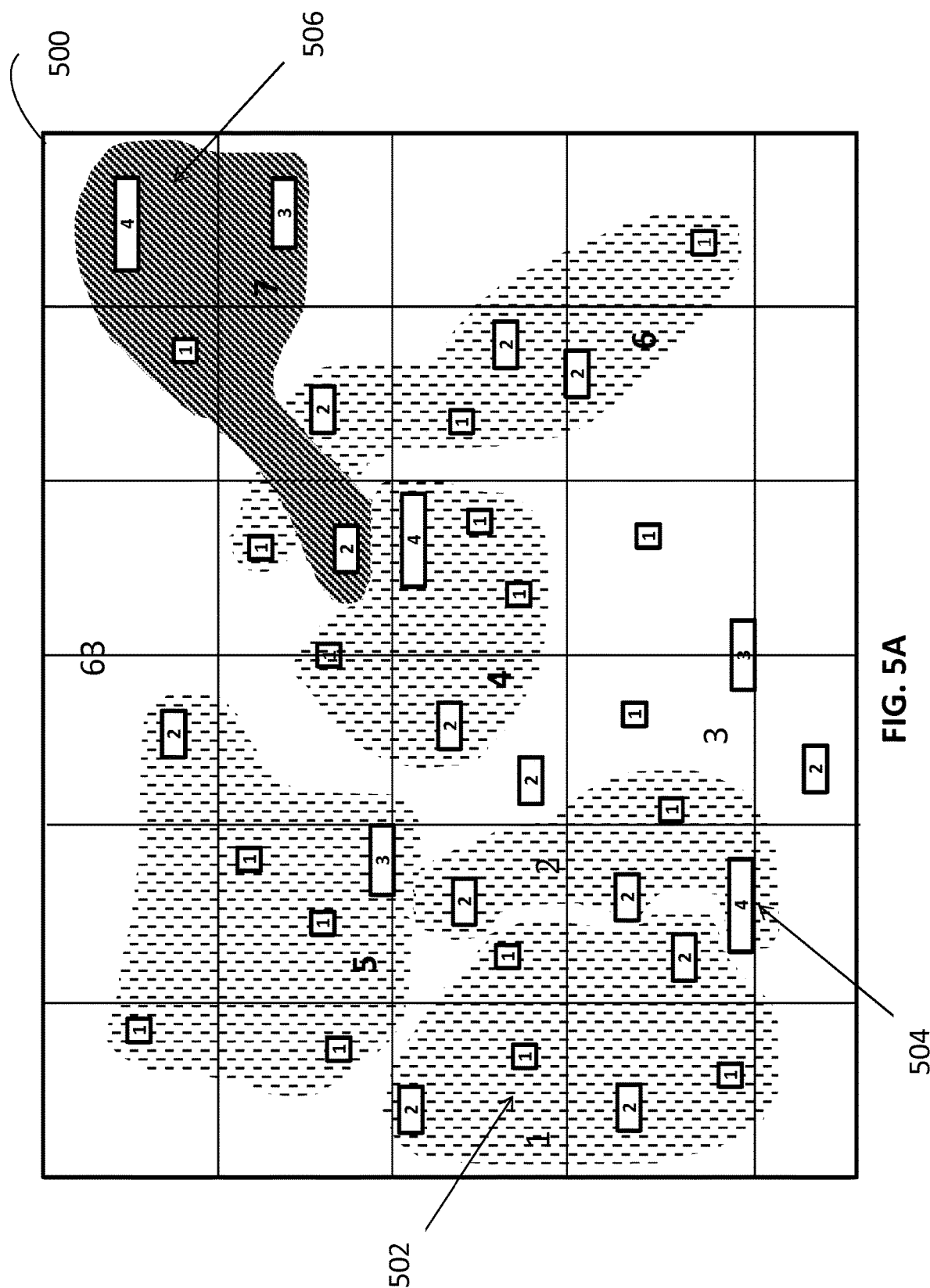
FIG. 5A illustrates an implementation of a distance-based grid for dividing scan segments into partitions of scan segments for padding segments with scan elements from the same or neighboring partitions.
Figure 5B:
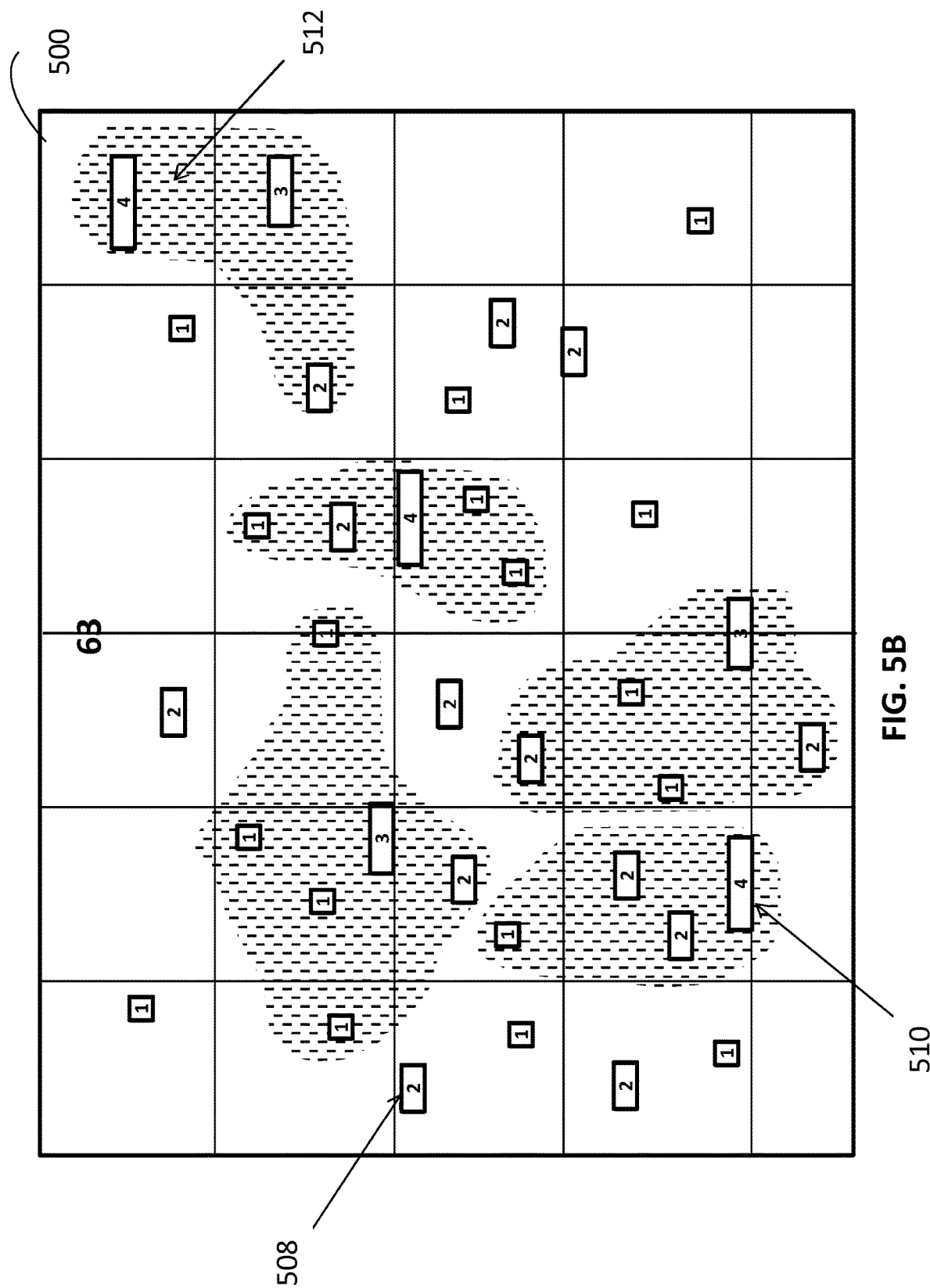
FIG. 5B illustrates an implementation of a distance-based grid for dividing scan segments into partitions of scan segments for padding long segments with scan elements from the same or neighboring partitions.

FIGS. 5A-5B illustrate an implementation of a distance-based grid for dividing scan segments into partitions of scan segments for padding segments with scan elements from the same or neighboring partitions, which provide a solution to the unsolvable imbalance of partitions such as that illustrated in FIGS. 4A-4B. To avoid such an insolvable imbalance, action to prevent the imbalance is required prior to a bisection step, which may include application of a segment padding algorithm. For example, scan segments may be padded with other scan elements to the target channel length, which will help to avoid this imbalance as the padded segments will already form complete channels of the optimally determined target scan chain length by themselves. In some embodiments, the resulting grid bisection of padded elements may still be imbalanced. Accordingly, the element swapping algorithm may then be used to further swap elements between partitions to achieve optimally balanced partitions.

Responsive to identifying an imbalance of scan elements that cannot be redistributed between the partitions to configure partitions each with a respective total scan length equal to the target scan chain length, for each imbalanced scan element, an absolute difference between the scan length of the respective imbalanced scan element and the target scan chain length may be determined. The segment padding algorithm may be applied iteratively while at least one imbalanced scan element has an absolute difference greater than zero. The imbalanced scan elements may be connected to the identified padding scan elements with wire to optimally configure scan chains for the determined target scan chain length.

As integrated circuit designs increase in complexity, the search for the optimal padding element candidates, that will be utilized to extend scan segment to a target scan length, may be very expensive and resource intensive in a chip design with many elements. As such, a segment padding algorithm may be developed which selects the padding scan elements based on being located at an optimally determined distance from the identified scan element to minimize test time and wire length, while optimizing compression.

In one embodiment, a distance-based grid, as illustrated in FIGS. 5A-5B, for example, as opposed to a density-based grid that may be utilized by a bisecting algorithm, may be applied to facilitate the padding of scan segments, such as segments 502, 504, and 506, with nearby elements from the same partition or neighboring partitions over chip area 500 of a 2-dimensional IC to search the distance based grid for padding elements in an efficient manner in terms of runtime and wire length. A distance-based grid may be utilized to implement the segment padding algorithm more efficiently by only evaluating relatively few elements as potential padding elements. The granularity of the distance based grid may be controlled. For example, the distance-based grid cells may be fifty microns wide and fifty microns high, which may control a tradeoff between maximum distance within a distance-based grid cell to ignore as negligible and runtime.

Figure 5C:
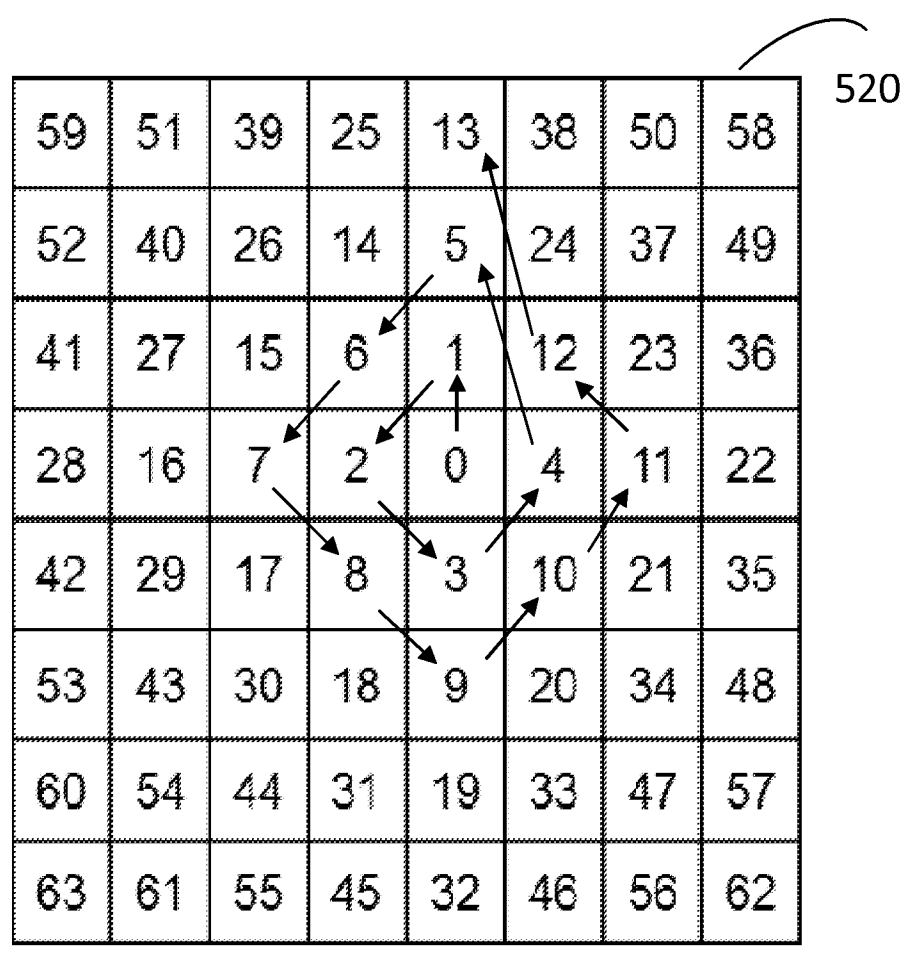

As illustrated in FIG. 5C, padding elements may be identified in order of an increasing Manhattan distance. For example, any potential padding element within the same partition has a Manhattan distance of zero and may be evaluated first for padding. A Manhattan distance, which is the distance between two points on a grid based strictly on a vertical and horizontal path, may be utilized in microelectronics with respect to routing wires. As such, padding candidates may be explored in order of increasing Manhattan distances with distances inside the partitions being ignored as negligible.

Padding element candidates within the same cell as the scan segment to be padded may be exhausted first. In each partition, when searching for elements to pad, elements that are longer are given preference, such that padding elements within each partition may be processed in order of decreasing length to avoid having to pad them separately later. Next, elements with a Manhattan distance of one may be processed for segment padding, followed by elements with a Manhattan distance of two, and so on.

In one aspect of the present disclosure, when IC designs include short segments, as compared to a target length, if the short segments are padded first and potentially all padded, available padding elements may be depleted, which may result in longer segments being left unpadded after all potential padding elements have been exhausted. As such, this may result in partition channels being finalized during the padding phase rather than the bisection phase, which may result in poor alignment with the 2D grid, and may also result in increased wire length.

For example, as illustrated in FIG. 5A, all shorter segments are padded including the one bit element in 502. As a result, for a longer segment, such as the four bit element 506, increased wire length may be needed to connect padded elements, as all of the elements that are closer to the element that needs to be padded have been exhausted. Additionally, if all of the shorter segments are padded first, available elements to pad longer segments may be depleted, as well as available elements that may be ultimately utilized for element swapping, as described herein.

In order to address these alignment and increased wire length concerns, a predetermined scan length may be identified for which only elements having a length greater than or equal to the predetermined scan length will be padded. For example, in one embodiment, only segments that are equal to or longer than 5% of the target scan chain length may be padded. This helps to ensure that the maximum deviation from the target channel length is in the order of 5%.

FIG. 5B illustrates such an implementation of a distance-based grid for dividing scan segments into partitions of scan segments for padding long segments, that are equal to or longer than three bits with scan elements from the same or neighboring partitions, which includes padding scan element such as 512, four bits, 510, four bits, but not padding scan elements like 508, two bits that is less than the determined three bits. These padded scan elements, such as 510 and 512, may be padded to the target scan length, nine bits in this example, and may be connected with wires to create optimal scan chains. Padding only longer segments minimizes the depletion of available padding elements, which helps to facilitate alignment with a 2-D compression grid structure.

Figure 6A:
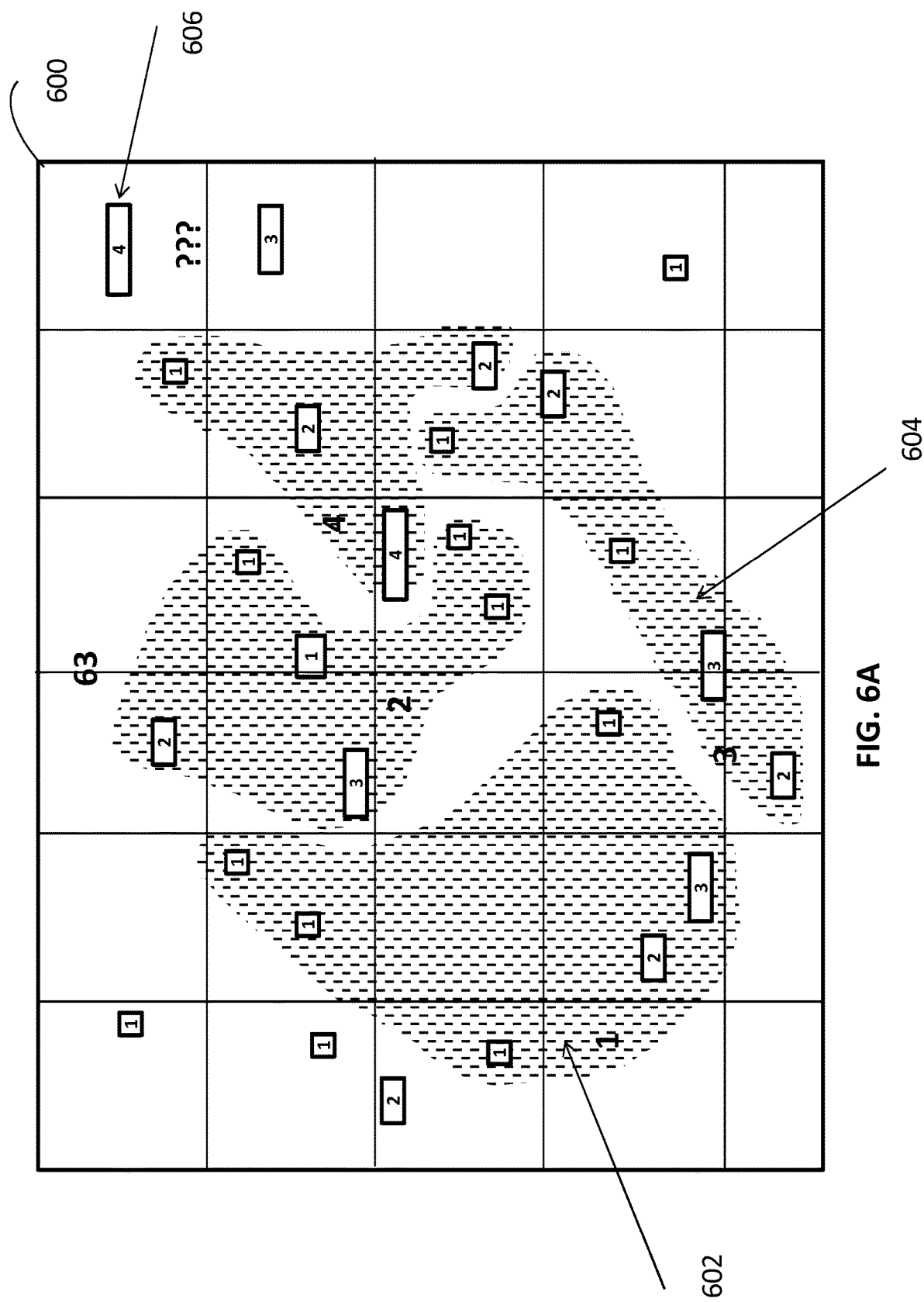
FIG. 6A illustrates an implementation of a distance-based grid for dividing scan segments into partitions of scan segments for padding, in a specific direction, segments with scan elements from the same or neighboring partitions.

FIG. 6A illustrates an implementation of a distance-based grid for dividing scan segments into partitions of scan segments, such as 602, 604, and 606, over chip area 600 of a 2-dimensional IC, for padding, in a specific direction, segments with scan elements from the same or neighboring partitions. If distance-based grid partitions are processed for padding in a specific direction, for example from the lower-left to the upper-right corner, available padding elements overall, as well as those that are optimally located may be progressively depleted. This may result in the available padding elements being increasingly farther away from the respective scan segment to be padded, as is the case for segment 606, resulting in longer wire length to connect the segment with padding elements.

Figure 6B:
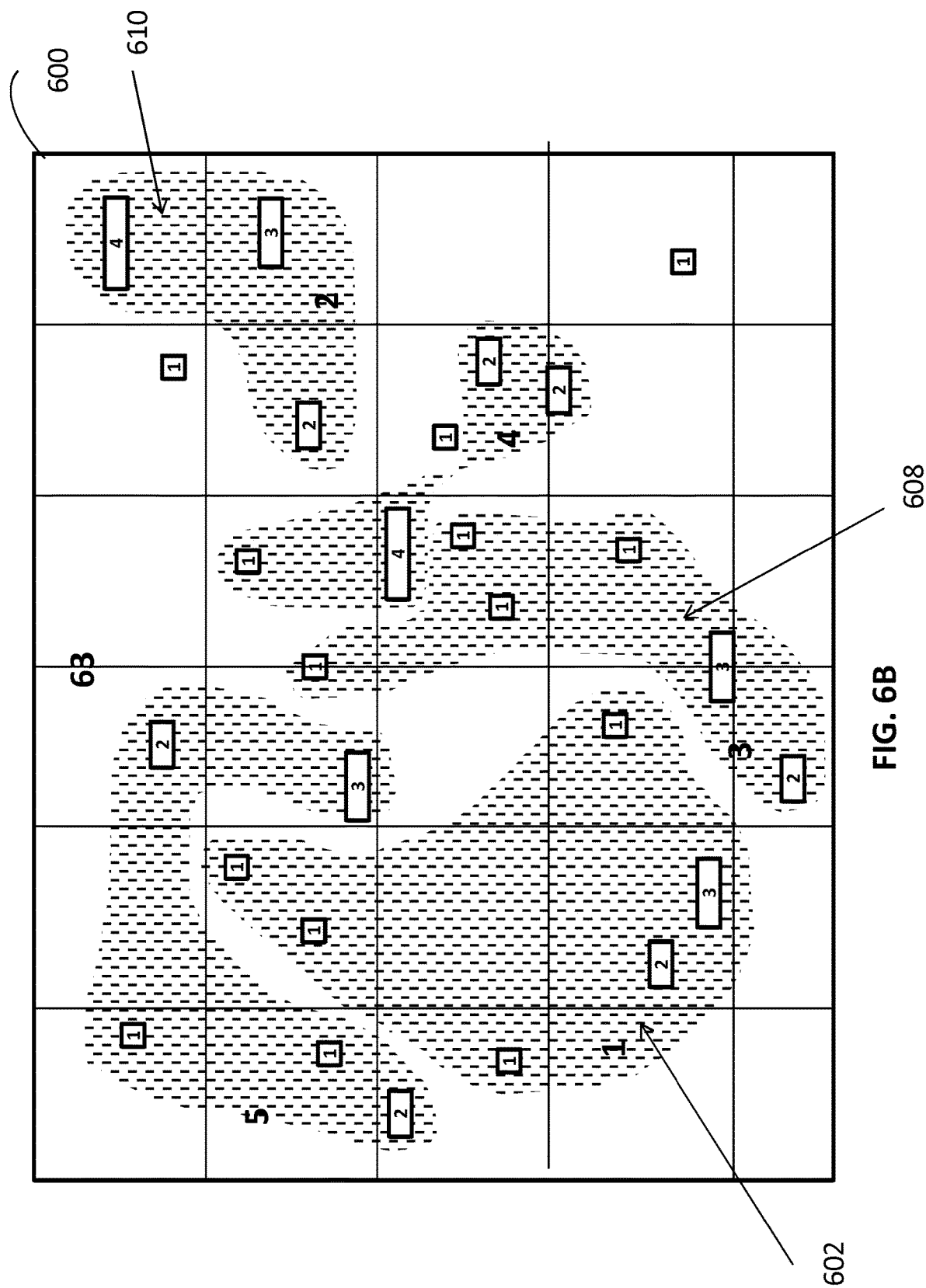
FIG. 6B illustrates an implementation of a distance-based grid for dividing scan segments into partitions of scan segments for padding, in a pseudo random order, segments with scan elements from the same or neighboring partitions.

FIG. 6B illustrates an implementation of a distance-based grid for dividing scan segments into partitions of scan segments, such as segments 602, 608, and 610 over chip area 600 of a 2-dimensional IC, for padding, in a pseudo random order, segments with scan elements from the same or neighboring partitions. Padding in a pseudo random order is utilized to avoid a potential progressive depletion of available padding elements in a region that may result from padding elements in a specific direction, and to maintain a relatively uniform spatial distribution of padding elements through the operation. By not progressively running out of elements to be used for padding, the distribution of elements that can be used for padding remains more constant throughout the padding operation. For example, as illustrated in FIG. 6B, scan segments may be padded to a target scan length of nine bits in a pseudo random order starting with segment 602, followed by segment 610, segment 608, and so forth. Padding in such a pseudo random order helps to avoid a depletion of available padding elements. For example as illustrated in FIG. 6A, by padding in a specific direction, the optimally located and available segments to pad the four bit scan segment 606 have been depleted. However, as illustrated in FIG. 6B, by padding in a pseudo random order, optimally located and available scan segments to pad the same four bit scan segment, as illustrated by scan segment 610, remain, maintaining a relatively uniform spatial distribution of padding elements while also minimizing wire length to connect the scan segment and associated padding elements.

FIGS. 7A-7D illustrate the implementation of a segment padding algorithm, followed by a bisecting algorithm, and ultimately applying an element swapping algorithm to optimally balance and connect scan segments in 2-D compression chains, optimizing an efficient compression architecture which minimizes scan testing resources and time.

One aspect of the present disclosure provides a method, implemented by a computer, for performing scan chain connection of an integrated circuit by optimally balancing and connecting scan segments in a 2-dimensional compression chain architecture. The method includes identifying an imbalance of scan elements that cannot be redistributed into a number of respective partitions each with a respective scan length equal to a target scan chain length; padding imbalanced scan elements with padding scan elements to extend the respective scan length of the identified imbalanced scan element to the target scan chain length; dividing testable logic into a 2-dimensional grid according to a bisecting distribution scheme; redistributing scan elements between respective partitions that have an absolute difference between a total scan length of the respective partition and the target scan chain length greater than zero to optimally reduce the absolute difference; and connecting the scan elements within each respective partition to configure a 2-dimensional compression chain for the target scan chain length.

Figure 7A:
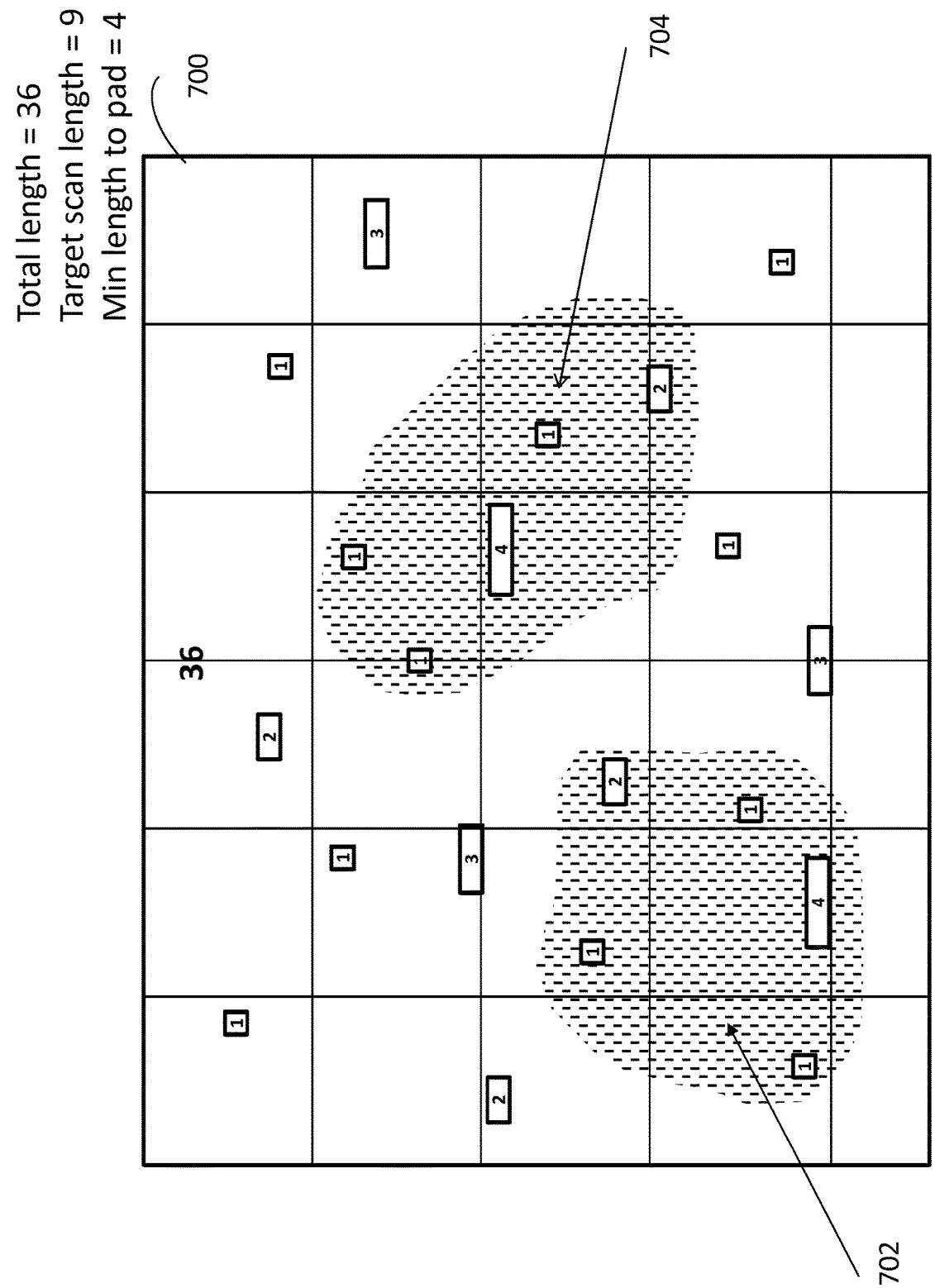
FIG. 7A illustrates an implementation of a distance-based grid for dividing scan segments into partitions of scan segments for padding, in a pseudo random order, long segments, with scan elements from the same or neighboring partitions.
Figure 7B:
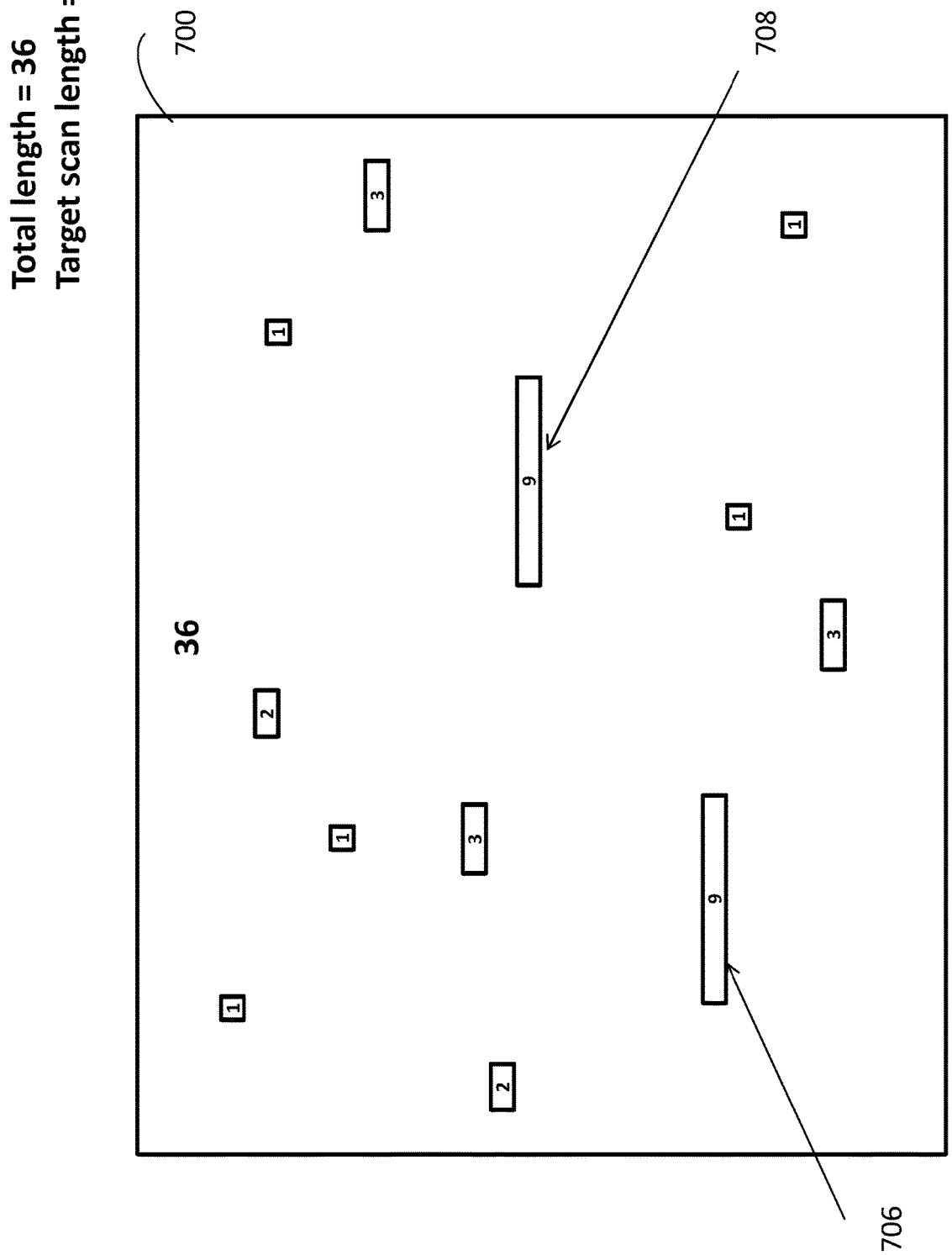
FIG. 7B illustrates distribution of single and multi-bit scan segments, including padded scan segments, over the chip area of a 2-dimensional IC.

FIG. 7A illustrates an initial implementation of a distance-based grid for dividing scan segments, such as 702 and 704 over chip area 700 of a 2-dimensional IC, into partitions of scan segments for padding, in a pseudo random order, long segments, with scan elements from the same or neighboring partitions. Upon determining a target scan chain length, for example nine bits, as illustrated in FIGS. 7A-7D, an area of an integrated circuit may be divided into a number of partitions of scan elements. Responsive to identifying an imbalance of scan elements that cannot be redistributed between the partitions to configure partitions each with a respective total scan length equal to the target scan chain length, an absolute difference between the scan length of the respective imbalanced scan element and the target scan chain length may be determined. A minimum length of a scan element to pad may be determined to minimize the depletion of optimally available padding elements, for example four bits, as illustrated in FIGS. 7A-7B.

A first identified imbalanced scan element, such as scan element 702, may be padded in a pseudo random order with at least one padding scan element to extend the scan length of the identified imbalanced scan element to the target scan chain length. The padding scan elements may be selected based on being located at an optimally determined distance from the identified scan element to minimize test time and wire length. In this case, four bit scan element 702 is padded with three one bit elements and a two bit element to create a target scan chain length of nine bits. Remaining imbalanced scan elements may also be padded. As illustrated in FIG. 7B, the imbalanced scan elements 702 and 704 may be connected to the padding scan elements using wire to optimally configure scan chains for the determined target scan chain length, as illustrated by scan chains 706 and 708, respectively.

Second, a bisection distribution scheme may be utilized to divide the testable logic into a 2-dimensional grid.

Figure 7C:
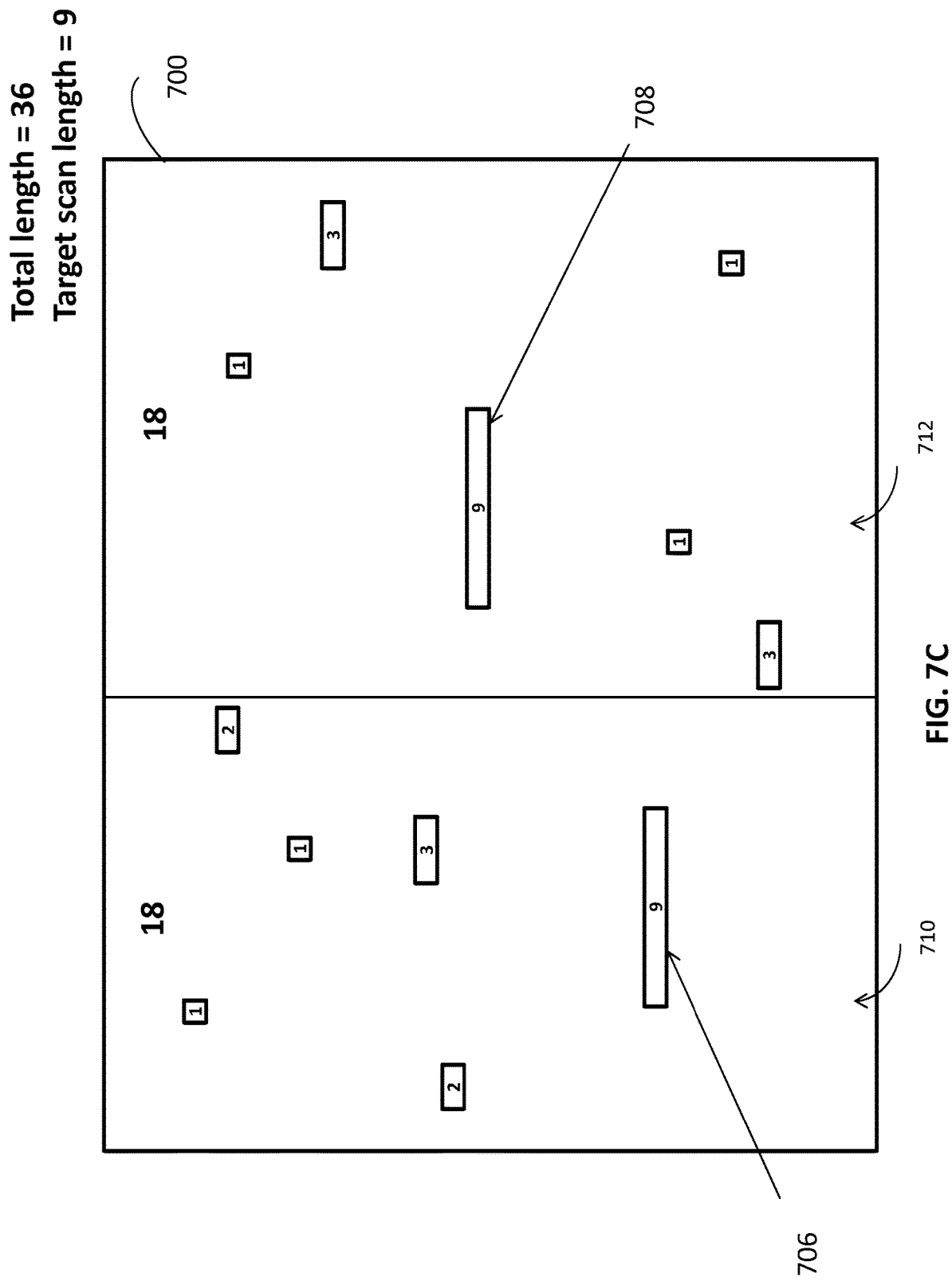
FIG. 7C illustrates an implementation of a vertical bisecting distribution scheme for dividing single and multi-bit scan segments, including padded scan segments, into partitions over the chip area of a 2-dimensional IC.
Figure 7D:
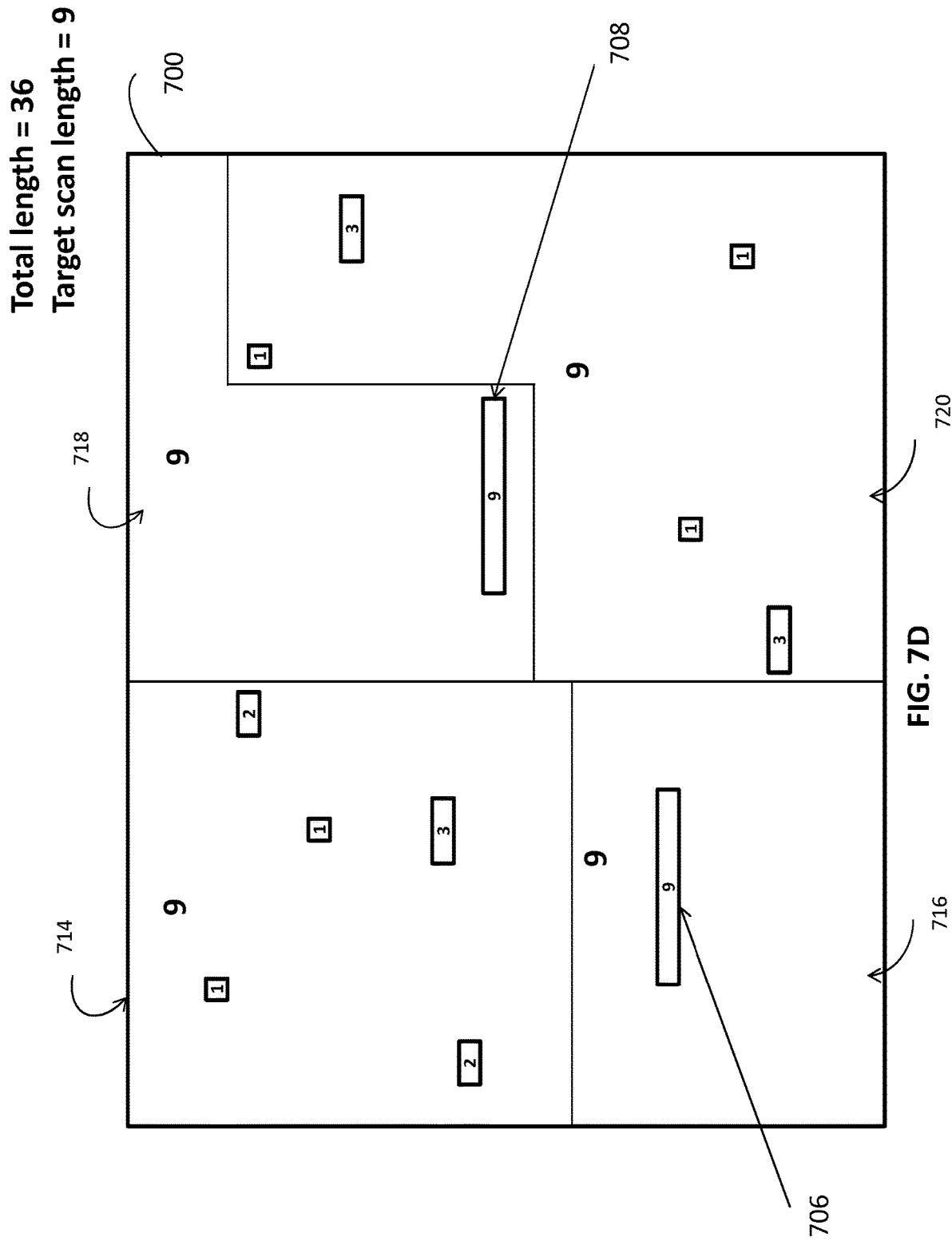
FIG. 7D illustrates an implementation of re-distribution vertical and horizontal bisecting distribution schemes by dividing single and multi-bit scan segments, including padded scan segments, into balanced partitions over the chip area of a 2-dimensional IC via bidirectional element swapping.

Finally, the vertical and horizontal bisecting distribution partitions may be redistributed to divide the padded scan segments, such as 706 and 708 into balanced partitions of the chip area 700 of an IC utilizing element swapping, as illustrated in FIGS. 7C and 7D, for example. For each respective partition of scan elements, a respective absolute difference between the total scan length of the respective partition and the target scan chain length may be determined. Responsive to a first respective absolute difference of a first respective partition being greater than zero, a second respective partition having a second respective absolute difference greater than zero may be identified. Upon identifying scan elements in the first respective partition and the second respective partition that are shorter than or equal to the respective absolute difference, the identified scan elements may be redistributed between the first respective partition and the second respective partition to optimally reduce the absolute difference. Remaining partitions having an absolute difference greater than zero may be balanced utilizing element swapping, and the scan elements within each balanced partition may be connected with wire to optimally configure a 2-dimensional compression chain for a determined target scan chain length.

One aspect of the present disclosure provides a design system which includes a memory and a processor configured to generate an integrated circuit design. The processor is configured to identify an imbalance of scan elements that cannot be redistributed into a number of respective partitions each with a respective scan length equal to a target scan chain length; pad the imbalanced scan elements with padding scan elements to extend the respective scan length of the identified imbalanced scan element to the target scan chain length; redistribute scan elements between respective partitions that have an absolute difference between a total scan length of the respective partition and the target scan chain length greater than zero to optimally reduce the absolute difference; and connect the scan elements within each respective partition to configure a 2-dimensional compression chain for the target scan chain length.

Figure 8:
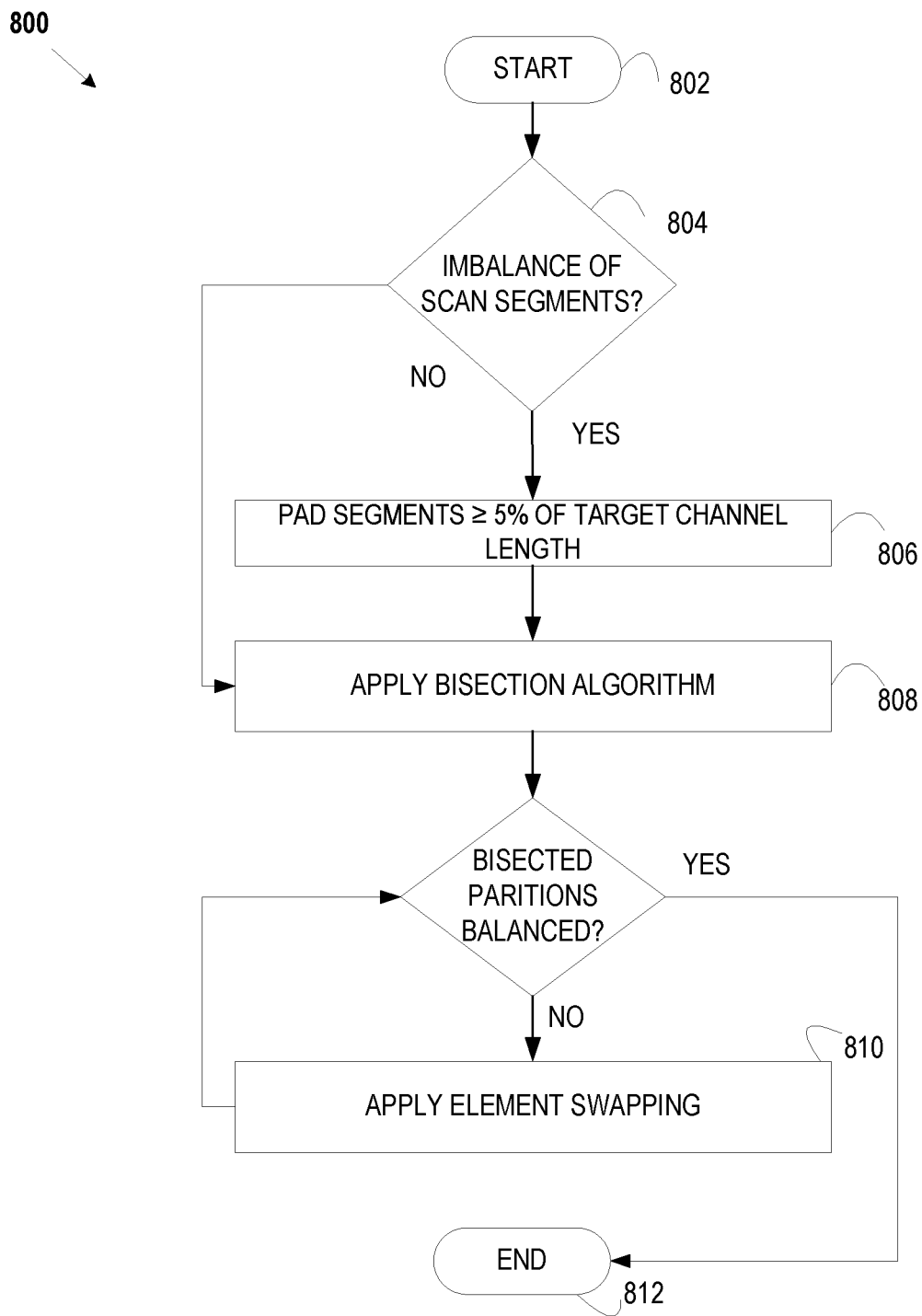
FIG. 8 illustrates a flowchart providing the steps of the method for optimally configuring scan segments in 2D compression grids utilizing element padding, a bisecting method, and/or element swapping.

FIG. 8 illustrates a flowchart providing steps of a method for optimally configuring scan segments in 2-D compression grids utilizing element padding, a bisecting method, and/or element swapping. The scan segments may include multi-bit registers including at least one of multi-stage flip-flops, serial shift registers, fixed segments, abstract segments, and/or floating segments.

The process may begin at block 802. According to block 804, the distribution of scan elements over the area of an integrated circuit will be evaluated to identify whether an imbalance of scan elements that cannot be redistributed between the partitions to configure partitions each with a respective total scan length equal to a target scan chain length exists. Upon detecting that such an imbalance exists, a minimum length of a scan element to pad may be determined to minimize the depletion of optimally available padding elements, for example 5% of the target channel length, as illustrated in block 806.

According to block 806, imbalanced scan elements may be padded in a pseudo random order with at least one padding scan element to extend the scan length of the identified imbalanced scan element to the target scan chain length. The padding scan elements may be selected based on being located at an optimally determined distance from the identified scan element to minimize test time and wire length. Remaining imbalanced scan elements may also be padded.

If such an imbalance of scan elements that cannot be redistributed is not identified, the process will continue at block 808. Likewise, upon completion of the element padding, the process will also continue at block 808, and a bisection distribution scheme, may be utilized to divide the testable logic into a 2-dimensional grid. The implementation of the bisecting distribution scheme may provide a determination of the total wire required to connect compression logic and decompression logic across a grid cell.

For each respective partition, a respective absolute difference between the total scan length of the respective partition and the target scan chain length will be determined to identify any imbalanced bisected partitions. If there are no identified imbalanced bisected partitions, the process may end at block 812. If imbalanced bisected partitions are identified, according to block 810, the vertical and horizontal bisecting distribution partitions may be redistributed to divide the scan segments into balanced partitions utilizing element swapping. For each respective partition of scan elements, a respective absolute difference between the total scan length of the respective partition and the target scan chain length may be determined. Responsive to a first respective absolute difference of a first respective partition being greater than zero, a second respective partition having a second respective absolute difference greater than zero may be identified. Upon identifying scan elements in the first respective partition and the second respective partition that are shorter than or equal to the respective absolute difference, the identified scan elements may be redistributed between the first respective partition and the second respective partition to optimally reduce the absolute difference. The scan elements that are closest to a boundary between a first respective partition and a second respective partition may be redistributed first to minimize test time and wire length. Remaining partitions having an absolute difference greater than zero may be balanced utilizing element swapping, and the scan elements within each balanced partition may be connected with wire to optimally configure a 2-dimensional compression chain for a determined target scan chain length.

The process may end at block 812.

Some of the foregoing embodiments refer to algorithms, sequences, macros, and operations that require execution of instructions and the usage of a memory. Execution of the instructions stored in memory may be performed by a processing device of an apparatus, the processing device specific to the apparatus. The apparatus hosting the processing device may be in some circumstances the ATE, or in other circumstances, the IC. The processing device executes, or selectively activates in order to execute, a computer program. The computer program is stored in memory associated with the apparatus. Memory available on the apparatus may include a computer readable storage medium, which is not limited to, but may include, any type of disk, including floppy disks, optical disks, CD-ROMs, magnetic-optical disks, read-only memories (ROMs), random access memories (RAMs), electrically erasable programmable read-only memory (EEPROM), flash memory, magnetic or optical cards, or an type of media that stores electronic instructions. Each of the memory devices implemented in the apparatus is further connected to or coupled to a system bus or a network connection, wired or unwired, capable of facilitating or driving communications.

In the foregoing Description of Embodiments, various features are grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

What is claimed is:

1. A method, implemented by a computer, for performing scan chain connection of an integrated circuit by optimally balancing and connecting scan segments in a 2-dimensional compression chain architecture, the method comprising:
   identifying an imbalance of scan elements that cannot be redistributed into a number of respective spatial partitions of a testable logic area of the integrated circuit, each with a respective scan length equal to a target scan chain length;
   padding imbalanced scan elements with padding scan elements to extend the respective scan length of the identified imbalanced scan element to the target scan chain length;
   redistributing scan elements between respective partitions that have an absolute difference between a total scan length of the respective partition and the target scan chain length greater than zero to optimally reduce the absolute difference; and
   connecting the scan elements within each respective partition to configure a 2-dimensional compression chain for the target scan chain length.

2. The computer implemented method of claim 1, further comprising utilizing a distance-based grid to identify padding scan elements.

3. The computer implemented method of claim 2, further comprising selecting padding scan elements from a same distance-based grid partition as the imbalanced scan element and/or from a neighboring distance-based grid partition as the imbalanced scan element.

4. The computer implemented method of claim 2, wherein identifying padding scan elements further comprises identifying padding scan elements in order of an increasing Manhattan distance.

5. The computer implemented method of claim 2, wherein identifying an imbalance of scan elements further comprises identifying imbalanced scan elements of at least a predetermined scan length.

6. The computer implemented method of claim 5, wherein the predetermined scan length is 5% of the determined target scan chain length.

7. The computer implemented method of claim 2, wherein identifying padding scan elements further comprises identifying padding scan elements for padding with imbalanced scan elements that are identified in a predetermined direction.

8. The computer implemented method of claim 2, wherein identifying padding scan elements further comprises identifying padding scan elements for padding with imbalanced scan elements that are identified in a pseudo random order.

9. The computer implemented method of claim 1, wherein the scan elements comprise multi-bit registers including at least one of multi-stage flip-flops, serial shift registers, fixed segments, abstract segments, and/or floating segments.

10. The computer implemented method of claim 1, further comprising identifying scan elements in a first respective partition and a second respective partition that are shorter than or equal to the respective absolute difference, and selecting the scan elements to be redistributed first that are closest to a boundary between the first respective partition and the second respective partition, to minimize test time and wire length.

11. A method, implemented by a computer, for performing scan chain connection of an integrated circuit by optimally balancing and connecting scan segments in a 2-dimensional compression chain architecture, the method comprising:
    identifying an imbalance of scan elements that cannot be redistributed into a number of respective spatial partitions of a testable logic area of the integrated circuit each with a respective scan length equal to a target scan chain length;
    padding imbalanced scan elements with padding scan elements to extend the respective scan length of the identified imbalanced scan element to the target scan chain length;
    dividing testable logic into a 2-dimensional grid according to a bisecting distribution scheme;
    redistributing scan elements between respective partitions that have an absolute difference between a total scan length of the respective partition and the target scan chain length greater than zero to optimally reduce the absolute difference; and
    connecting the scan elements within each respective partition to configure a 2-dimensional compression chain for the target scan chain length.

12. The computer implemented method of claim 11, wherein the implementation of the bisecting distribution scheme provides a determination of a total amount of wire required to connect compression logic and decompression logic across a grid cell.

13. The computer implemented method of claim 11, wherein identifying scan elements in the first respective partition and the second respective partition that are shorter than or equal to the respective absolute difference comprises selecting the scan elements to be redistributed first that are closest to a boundary between the first respective partition and the second respective partition, to minimize test time and wire length.

14. The computer implemented method of claim 11, further comprising utilizing a distance-based grid to identify padding scan elements and selecting scan elements from a same distance-based grid partition as the imbalanced scan element and/or from a neighboring distance-based grid partition as the imbalanced scan element.

15. The computer implemented method of claim 14, wherein identifying padding scan elements further comprises identifying padding scan elements in order of an increasing Manhattan distance.

16. The computer implemented method of claim 14, wherein identifying an imbalance of scan elements further comprises identifying imbalanced scan elements of at least a predetermined scan length.

17. The computer implemented method of claim 16, wherein the predetermined scan length is 5% of the determined target scan chain length.

18. The computer implemented method of claim 14, wherein identifying padding scan elements further comprises identifying padding scan elements for padding with imbalanced scan elements that are identified in a predetermined direction.

19. The computer implemented method of claim 14, wherein identifying padding scan elements further comprises identifying padding scan elements for padding with imbalanced scan elements that are identified in a pseudo random order.

20. A design system, comprising: a memory; and
    a processor configured to generate an integrated circuit design that:
        identifies an imbalance of scan elements that cannot be redistributed into a number of respective spatial partitions of a testable logic area of the integrated circuit design each with a respective scan length equal to a target scan chain length;
        pads the imbalanced scan elements with padding scan elements to extend the respective scan length of the identified imbalanced scan element to the target scan chain length;
        redistributes scan elements between respective partitions that have an absolute difference between a total scan length of the respective partition and the target scan chain length greater than zero to optimally reduce the absolute difference; and
        connects the scan elements within each respective partition to configure a 2-dimensional compression chain for the target scan chain length.

* * * * *